United States Patent
Chen et al.

(10) Patent No.: US 12,519,376 B2
(45) Date of Patent: Jan. 6, 2026

(54) TECHNIQUE FOR DISSIPATING HEAT IN ELECTRIC WORK MACHINE

(71) Applicant: MAKITA CORPORATION, Anjo (JP)

(72) Inventors: Jie Chen, Suzhou (CN); Katsuhito Fujinami, Anjo (JP); Hong Jun Pang, Suzhou (CN); Ya Wang, Suzhou (CN); Fuchao Luan, Suzhou (CN); Akira Naito, Anjo (JP)

(73) Assignee: MAKITA CORPORATION, Anjo (JP)

( * ) Notice: Subject to any disclaimer, the term of this patent is extended or adjusted under 35 U.S.C. 154(b) by 582 days.

(21) Appl. No.: 17/852,065

(22) Filed: Jun. 28, 2022

(65) Prior Publication Data

US 2023/0011554 A1 Jan. 12, 2023

(30) Foreign Application Priority Data

Jul. 6, 2021 (JP) .................................. 2021-112154
Sep. 8, 2021 (JP) .................................. 2021-146122

(51) Int. Cl.
*H05K 7/20* (2006.01)
*B24B 23/02* (2006.01)
(Continued)

(52) U.S. Cl.
CPC ............. *H02K 9/227* (2021.01); *B24B 23/02* (2013.01); *B24B 47/12* (2013.01); *B25F 5/008* (2013.01);
(Continued)

(58) Field of Classification Search
CPC ... H01L 23/3672; H01L 23/34; H01L 23/367; H05K 1/181; H05K 1/0203; H05K 7/209;
(Continued)

(56) References Cited

U.S. PATENT DOCUMENTS 6,068,051 A * 5/2000 Wendt ................. H01L 23/3675
361/720
6,385,047 B1 * 5/2002 McCullough ......... H01L 23/467
257/722
(Continued)

FOREIGN PATENT DOCUMENTS

| JP | 2006-218560 A | 8/2006 |
| JP | 2009-012149 A | 1/2009 |
| TW | M375186 U * | 3/2010 |

OTHER PUBLICATIONS

Apr. 1, 2025 Office Action issued in Japanese Patent Application No. 2021-146122.

*Primary Examiner* — Mandeep S Buttar
(74) *Attorney, Agent, or Firm* — Oliff PLC

(57) ABSTRACT

An electric work machine in one aspect of the present disclosure includes an electric power input terminal, a motor, a circuit board, a first heat dissipation plate, and a second heat dissipation plate. The circuit board includes a first surface and an electronic circuit on the first surface. The electronic circuit controls supply of AC power to the motor. The electronic circuit includes an electronic component that generates Joule heat. The first heat dissipation plate is spaced from the first surface by a first distance in parallel to the first surface. The second heat dissipation plate is spaced from the first surface by a second distance in parallel to the first surface. The second heat dissipation plate is thermally coupled with the first heat dissipation plate. The second distance is smaller than the first distance.

19 Claims, 10 Drawing Sheets

(51) Int. Cl.
  *B24B 47/12*   (2006.01)
  *B25F 5/00*    (2006.01)
  *H02K 9/22*    (2006.01)
  *H02K 11/33*   (2016.01)
  *H02P 27/02*   (2016.01)
(52) U.S. Cl.
  CPC ............. *H02K 11/33* (2016.01); *H02P 27/02* (2013.01); *H02K 2211/03* (2013.01)
(58) Field of Classification Search
  CPC ...... H05K 1/111; H05K 3/341; H05K 1/0204; H05K 2201/066; H05K 7/20154; H05K 7/20254; H05K 7/20509; H02K 11/33; H02K 7/145; H02K 9/227; G06F 1/20
  USPC ................ 165/80.3, 185; 257/706, 707, 712, 257/E23.102; 361/704, 720, 702, 709, 361/690, 710, 719
  See application file for complete search history.

(56) References Cited

U.S. PATENT DOCUMENTS

| | | | |
|---|---|---|---|
| 2009/0015183 A1 | 1/2009 | Watanabe | |
| 2009/0283246 A1* | 11/2009 | Chen | H01L 23/3672 165/80.3 |
| 2017/0042066 A1* | 2/2017 | Sakamoto | H05K 1/111 |
| 2018/0342932 A1 | 11/2018 | Wachter et al. | |
| 2019/0320555 A1* | 10/2019 | Flavin | H05K 7/20409 |
| 2020/0227975 A1* | 7/2020 | Purohit | H02K 7/14 |

* cited by examiner

TECHNIQUE FOR DISSIPATING HEAT IN ELECTRIC WORK MACHINE

CROSS-REFERENCE TO RELATED APPLICATIONS

This application claims the benefits of Japanese Patent Application No. 2021-112154 filed on Jul. 6, 2021 with the Japan Patent Office and Japanese Patent Application No. 2021-146122 filed on Sep. 8, 2021 with the Japan Patent Office, and the entire disclosure of Japanese Patent Application No. 2021-112154 and the entire disclosure of Japanese Patent Application No. 2021-146122 are incorporated herein by reference.

BACKGROUND

The present disclosure relates to an electric work machine.

Japanese Unexamined Patent Application Publication No. 2009-012149 discloses one example of a power tool. This power tool includes a motor. The motor receives AC (alternating current) power from an AC power supply, and is driven with the AC power. This power tool includes a motor control IC that controls driving of the motor. The power tool further includes a power supplier that supplies power-supply power to the motor control IC. The power supplier receives the AC power, and generates the power-supply power from the AC power.

SUMMARY

In the above-described power tool, the power supplier generates the power-supply power regardless of whether the motor is being driven. Thus, the power supplier consumes the AC power supplied from the AC power supply even when the motor is not being driven. This may cause increased heat generation in the power supplier.

Specifically, the above example of the power supplier includes a capacitor, a resistor, and a diode, which are connected in series with each other. When the AC power is supplied to the power supplier, the capacitor is charged. Such charging of the capacitor results in generation of the power-supply power having a constant DC (direct current) voltage. An AC voltage of the AC power supply is rectified by the diode, thereby being converted to the DC voltage. The resistor steps down the DC voltage, and applies the stepped down voltage to the capacitor. The resistor generates a heat due to a DC current flowing through the resistor. Since a relatively large current flows through the resistor, an amount of the heat generated from the resistor may be increased. Thus, it is desired that the heat generated especially in the resistor be able to be dissipated efficiently.

In one aspect of the present disclosure, it is desirable to be able to efficiently dissipate a heat generated in a circuit mounted in an electric work machine.

An electric work machine in one aspect of the present disclosure includes an electric power input terminal. The electric power input terminal receives AC power. The electric work machine includes a motor. The motor is driven with the AC power received through the electric power input terminal. The electric work machine includes a mounting part. The mounting part is (i) detachably attached to a tool, or (ii) fixed to the tool. The mounting part transmits a rotational force of the motor to the tool.

The electric work machine includes a circuit board. The circuit board includes a first surface. The circuit board includes an electronic circuit on the first surface. The electronic circuit controls supply of the AC power to the motor. The electronic circuit includes an electronic component that generates a Joule heat (or that causes heat loss). The first surface may correspond to a surface of a plate member of the circuit board. The plate member may include an insulator, such as resin.

The electric work machine includes a first heat dissipation plate (or first heat sink, or first heat sink plate) spaced from the first surface by a first distance in parallel to the first surface. The first heat dissipation plate has a plate-like shape.

The electric work machine includes a second heat dissipation plate (or second heat sink, or second heat sink plate) spaced from the first surface by a second distance in parallel to the first surface. The second heat dissipation plate has a plate-like shape. The second distance is smaller than the first distance. The second heat dissipation plate is thermally coupled with the first heat dissipation plate. In other words, the second heat dissipation plate can conduct a heat of the second heat dissipation plate to the first heat dissipation plate.

To put it in still another way, the electric work machine includes a heat dissipation member (or heat sink). The heat dissipation member is configured to (i) receive a heat generated in the circuit board and (ii) dissipate the heat. The heat dissipation member includes the first heat dissipation plate and the second heat dissipation plate.

Such an electric work machine makes it possible to efficiently dissipate the heat generated in the circuit board to the outside of the circuit board (or to efficiently cool the circuit board).

Another aspect of the present disclosure is a method for dissipating a heat generated in an electric work machine. The method includes providing a first heat dissipation plate in parallel to a first surface of a circuit board of the electric work machine such that the first heat dissipation plate is spaced from the first surface by a first distance. The method includes providing a second heat dissipation plate in parallel to the first surface such that the second heat dissipation plate is (i) spaced from the first surface by a second distance smaller than the first distance, and (ii) thermally coupled with the first heat dissipation plate.

Such a method can produce an effect similar to that of the above-described electric work machine.

BRIEF DESCRIPTION OF THE DRAWINGS

Example embodiments of the present disclosure will be described below with reference to the accompanying drawings, in which.

DETAILED DESCRIPTION OF EXEMPLARY EMBODIMENTS

Figure 1:
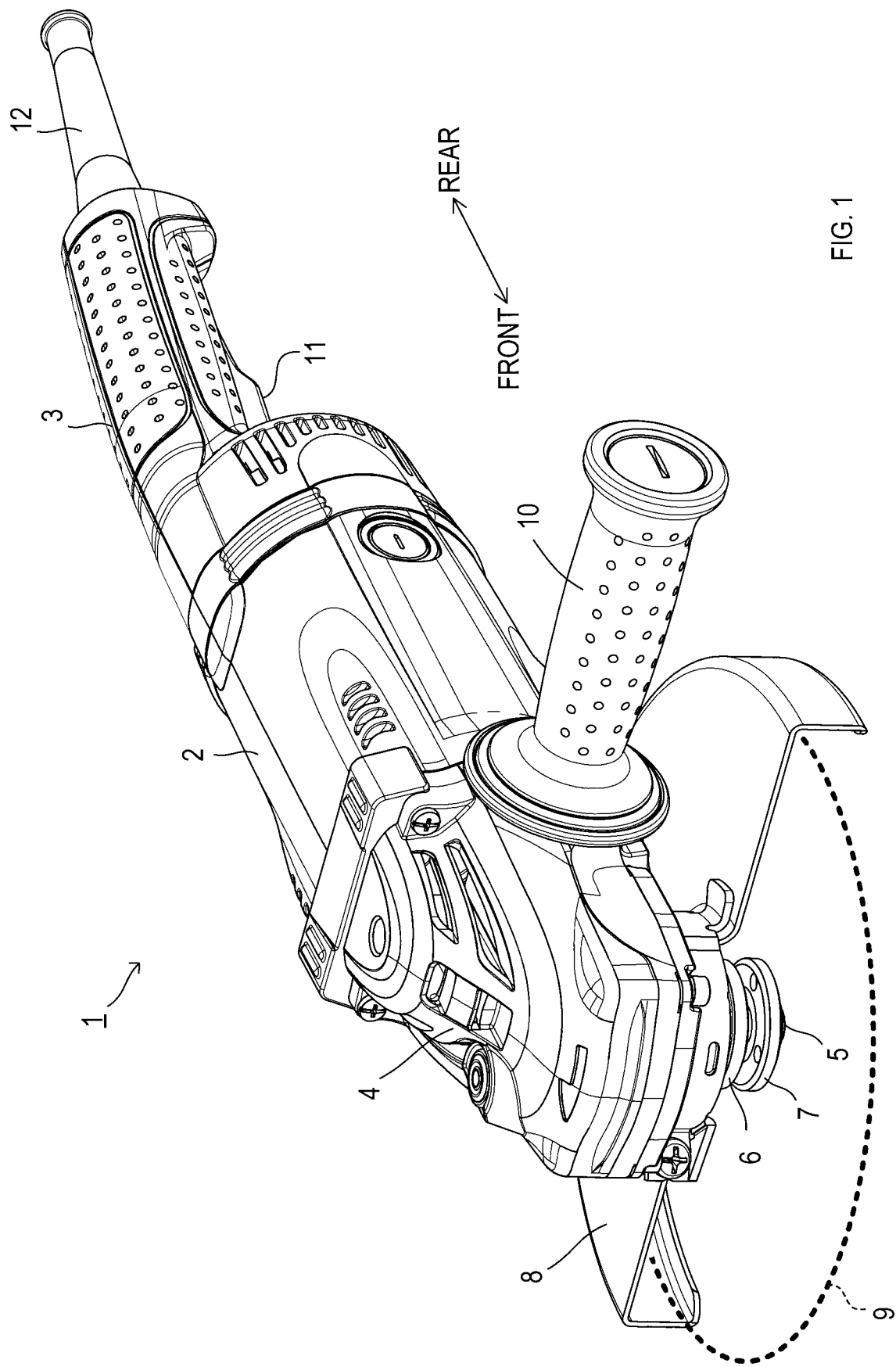
FIG. 1 is a perspective view of an electric work machine of an embodiment.

1. Overview of Embodiments (1-1) Chapter 1

An electric work machine in one embodiment may include an electric power input terminal. The electric power input terminal may receive an AC power. Additionally or alternatively, the electric work machine may include a motor. The motor may be driven with the AC power received via the electric power input terminal. Additionally or alternatively, the electric work machine may include a mounting part. The mounting part may be (i) detachably attached to a tool, or (ii) fixed to the tool. The mounting part may transmit a rotational force of the motor to the tool.

Additionally or alternatively, the electric work machine may include a circuit board. The circuit board may include a first surface. The circuit board may include an electronic circuit on the first surface. The electronic circuit may control supply of the AC power to the motor. The electronic circuit may include an electronic component that generates Joule heat (or that causes heat loss). The first surface may correspond to a surface of a plate member of the circuit board. The plate member may include an insulator, such as resin. The plate member may include the insulator partially, or the entirety of the plate member may be the insulator.

Additionally or alternatively, the electric work machine may include a first heat dissipation plate (or first heat sink, or first heat sink plate) spaced from the first surface by a first distance in parallel to the first surface. The first heat dissipation plate has a plate-like shape.

Additionally or alternatively, the electric work machine may include a second heat dissipation plate (or second heat sink, or second heat sink plate) spaced from the first surface by a second distance in parallel to the first surface. The second heat dissipation plate has a plate-like shape. The second distance may be smaller than the first distance. The second heat dissipation plate may be thermally coupled with the first heat dissipation plate. In other words, the second heat dissipation plate may be able to conduct a heat of the second heat dissipation plate to the first heat dissipation plate.

Additionally or alternatively, the electric work machine may include a heat dissipation member (or heat sink). The heat dissipation member may be configured such that a heat generated in the circuit board is conducted to the heat dissipation member. The heat dissipation member may be configured to dissipate the heat received from the circuit board. The heat dissipation member may include the first heat dissipation plate and the second heat dissipation plate.

In a case where an electric work machine in one embodiment includes the above-described electric power input terminal, the above-described motor, the above-described mounting part, the above-described circuit board, and the above-described first and second heat dissipation plates, such an electric work machine makes it possible to efficiently dissipate the heat generated in the circuit board to the outside of the circuit board (or to efficiently cool the circuit board). More specifically, such an electric work machine makes it possible to efficiently dissipate a heat generated from the electronic component.

In such an electric work machine, the heat generated from the circuit board can be conducted to the first heat dissipation plate and/or to the second heat dissipation plate directly and/or through a space. The conducted heat can be dissipated from the first heat dissipation plate and/or from the second heat dissipation plate. Moreover, the second distance is different from the first distance, and thus, the heat generated in the circuit board can be efficiently dissipated to the outside of the circuit board.

To enhance the heat dissipation performance, it is conceivable, for example, to use a large heat sink in which two or more large heat dissipation fins are arranged. However, use of such a heat sink leads to an increase in the size of the electric work machine. On the other hand, the electric work machine configured as described above includes the first and second heat dissipation plates, to thereby enable efficient dissipation of the heat from the circuit board while reducing an increase in the size of the first and second heat dissipation plates.

The second heat dissipation plate may be thermally coupled with the first heat dissipation plate in any manner. For example, the second heat dissipation plate may be in direct contact with the first heat dissipation plate. Alternatively, the second heat dissipation plate may be connected to the first heat dissipation plate via a tangible member. That is, the heat of the second heat dissipation plate may be conducted to the first heat dissipation plate via the tangible member. Even when the second heat dissipation plate is spaced from the first heat dissipation plate, conduction of the heat from the second heat dissipation plate to the first heat dissipation plate can be performed by so-called convection or thermal radiation. However, the above-described "thermally coupled" state need not include such a state in which conduction of the heat can be performed by convection or thermal radiation.

Additionally or alternatively, the second heat dissipation plate may include a first part facing the electronic component. In other words, at least part of the second heat dissipation plate may face the electronic component.

In a case where an electric work machine in one embodiment includes the above-described first part, such an electric work machine makes it possible to efficiently dissipate the heat generated from the electronic component via the second heat dissipation plate.

Additionally or alternatively, the second heat dissipation plate may include a second part. The second part may face the first heat dissipation plate in a direction perpendicular to the first surface. The first heat dissipation plate may include a part not facing the second heat dissipation plate. The second heat dissipation plate may include a part not facing the first heat dissipation plate.

In a case where an electric work machine in one embodiment includes the above-described first and second heat dissipation plates, such an electric work machine makes it possible to reduce an increase in the size of the first and second heat dissipation plates as a whole. In other words, in a case where the first and second heat dissipation plates are formed as a single member (or a single component), an increase in the size of the single member can be reduced.

Additionally or alternatively, the electric work machine may include a coupling member (or a bent part) thermally coupling the first heat dissipation plate with the second heat dissipation plate. Additionally or alternatively, the electric work machine may include a single member configured with the first and second heat dissipation plates and the coupling member. In other words, the first and second heat dissipation plates and the coupling member may be formed as the single member. The first and second heat dissipation plates and the coupling member may be formed in one piece. The first heat dissipation member and/or the second heat dissipation member may include an opening (or a cutout). The opening may be formed in a bay-like shape. The electric work machine may include an additional electronic component arranged so as to pass through the opening.

In a case where an electric work machine in one embodiment includes the above-described single member, such an electric work machine enables easy formation of the first and second heat dissipation plates capable of mutually conducting the heat, that is, easy formation of the single member.

Additionally or alternatively, the electric work machine may include a third heat dissipation plate thermally coupled with the second heat dissipation plate. The third heat dissipation plate has a plate-like shape. The thermal conductivity of the third heat dissipation plate may be higher than the thermal conductivity of air. The third heat dissipation plate may contain metal (e.g., aluminum or copper).

In a case where an electric work machine in one embodiment includes the above-described third heat dissipation plate, such an electric work machine makes it possible to efficiently dissipate the heat generated from the electronic component via the second heat dissipation plate. Specifically, the heat conducted from the circuit board to the second heat dissipation plate can be efficiently dissipated via the first heat dissipation plate and via the third heat dissipation plate. Thus, the efficiency of heat dissipation can be further improved.

In the case where the electric work machine includes the third heat dissipation plate, the first heat dissipation plate does not necessarily have to face the second heat dissipation plate and/or the third heat dissipation plate. In other words, the first heat dissipation plate may include a part not facing the second heat dissipation plate and/or a part not facing the third heat dissipation plate.

Additionally or alternatively, the third heat dissipation plate may be spaced from the first surface by a third distance in parallel to the first surface. The third distance may be greater than the second distance. The third distance may be equal to or different from the first distance. The third heat dissipation plate may include a third part. The third part may face the second heat dissipation plate in a direction perpendicular to the first surface. Additionally or alternatively, the third heat dissipation plate may be spaced from the first heat dissipation plate.

In a case where an electric work machine in one embodiment includes the above-described third heat dissipation plate, such an electric work machine makes it possible to reduce an increase in the size of the first to third heat dissipation plates as a whole. In other words, in a case where the first to third heat dissipation plates are formed as a single member, an increase in the size of the single member can be reduced. In addition, complication of the shape of the single member can be reduced, thus enabling easy formation of the single member.

Additionally or alternatively, the circuit board may be housed in a case. Additionally or alternatively, the case may be filled with a filler (or a potting compound). In this case, the first to third heat dissipation plates may be partially embedded in the filler. Specifically, the second heat dissipation plate may be completely embedded in the filler, for example. It may be possible that the entirety of the first and third heat dissipation plates are not embedded in the filler or that the first and third heat dissipation plates are partially embedded in the filler. The filler may protect the electronic circuit from water, moisture, dust, impact, and/or vibration.

The filler may be formed by hardening an insulating liquid compound. The filler may include an epoxy resin, a thermosetting plastic, or a silicon rubber gel.

Additionally or alternatively, the electric work machine may include a coupling member thermally coupling the second heat dissipation plate with the third heat dissipation plate. Additionally or alternatively, the electric work machine may include a single member configured with the first to third heat dissipation plates and the coupling member. In other words, the first to third heat dissipation plates and the coupling member may be formed as the single member. The first to third heat dissipation plates and the coupling member may be formed in one piece. Additionally or alternatively, the second heat dissipation plate, the coupling member, and the third heat dissipation plate may form a U-shaped cross-section that is perpendicular to the first surface. Such a single member may be formed by, for example, bending a plate material at approximately 180 degrees. In this case, the bent part may correspond to the above-described coupling member. The first heat dissipation plate, the second heat dissipation plate, and/or the third heat dissipation plate may include an opening (or a cutout). The opening may be formed in a bay-like shape. The electric work machine may include an additional electronic component arranged so as to pass through the opening.

In a case where an electric work machine in one embodiment includes the above-described single member, such an electric work machine enables easy formation of the first to third heat dissipation plates capable of mutually conducting the heat, that is, easy formation of the single member.

Additionally or alternatively, the electronic component may include a resistor. Additionally or alternatively, the first and second heat dissipation plates may be spaced from the resistor.

In a case where an electric work machine in one embodiment includes the above-described resistor, such an electric work machine enables insulation of the resistor from the first and second heat dissipation plates and also efficient dissipation of the heat generated from the resistor (or efficient cooling of the resistor).

Additionally or alternatively, the electronic circuit may include a current path. Additionally or alternatively, the current path may electrically connect the electric power input terminal to the motor. Additionally or alternatively, the electronic circuit may include a switch on the current path. The switch may be (i) configured to complete or interrupt the current path and (ii) thermally coupled with the first heat dissipation plate or with the second heat dissipation plate. The switch may be thermally coupled with the first heat dissipation plate. The switch may be in contact with the first heat dissipation plate.

In a case where an electric work machine in one embodiment includes the above-described current path, such an electric work machine makes it possible to efficiently dissipate the heat generated from the switch via the first heat dissipation plate or via the second heat dissipation plate. In a case where the switch is thermally coupled with the first heat dissipation plate and also where the electronic component faces the second heat dissipation plate, the switch and the electronic component can be efficiently cooled via the first heat dissipation plate and via the second heat dissipation plate.

Additionally or alternatively, the first heat dissipation plate and/or the second heat dissipation plate may include a leg fixed to the circuit board. Additionally or alternatively, a single member, configured with the leg together with the first heat dissipation plate or the second heat dissipation plate, may be provided. In other words, the leg, and the first heat dissipation plate or the second heat dissipation plate, may be formed as the single member. The leg, and the first heat dissipation plate or the second heat dissipation plate, may be formed in one piece.

The first heat dissipation plate and/or the second heat dissipation plate may have a thermal conductivity higher than the thermal conductivity of air. The first heat dissipation plate and/or the second heat dissipation plate may contain metal. The metal may include aluminum or copper.

A method for dissipating the heat generated in an electric work machine in one embodiment may include providing the first heat dissipation plate to the first surface of the circuit board of the electric work machine such that the first heat dissipation plate is (i) parallel to the first surface and (ii) spaced from the first surface by the first distance. Additionally or alternatively, the method may include providing the second heat dissipation plate to the first surface such that the second heat dissipation plate is (i) parallel to the first surface, (ii) separated from the first surface by the second distance, which is smaller than the first distance, and (iii) thermally coupled with the first heat dissipation plate.

In a case where an electric work machine in one embodiment is configured to dissipate heat by the above-described method, such an electric work machine makes it possible to efficiently dissipate the heat generated in the circuit board to the outside of the circuit board.

In one embodiment, the above-described features may be combined in any manner. In one embodiment, any of the above-described features may be excluded.

(1-2) Chapter 2

An electric work machine in one embodiment may include a first current path. The first current path may be configured to receive an AC power from an AC power supply. Additionally or alternatively, the electric work machine may include a motor. The motor may be arranged on the first current path. The motor may be configured to be driven with the AC power. Additionally or alternatively, the electric work machine may include a driving mechanism. The driving mechanism may be configured such that a tool is detachably attached thereto. The driving mechanism may be configured to transmit rotation of the motor to the tool.

Additionally or alternatively, the electric work machine may include a motor driving circuit. The motor driving circuit may be activated by receiving a first electric power. The motor driving circuit may be configured to control supply of the AC power to the motor.

Additionally or alternatively, the electric work machine may include a first power-supply circuit. The first power-supply circuit may be configured to receive the AC power from the first current path. The first power-supply circuit may be further configured to receive a power-supply control signal. The first power-supply circuit may be configured to generate the first electric power from the AC power in response to having received or receiving the power-supply control signal. The first power-supply circuit may be configured to stop generation of the first electric power in response to input of the power-supply control signal having been stopped.

Additionally or alternatively, the electric work machine may include a power-supply control circuit. The power-supply control circuit may be configured to be activated by receiving a second electric power. The power-supply control circuit may be configured to output the power-supply control signal to the first power-supply circuit in response to a driving requirement having been satisfied. The power-supply control circuit may be configured to stop output of the power-supply control signal in response to non-satisfaction of the driving requirement.

Additionally or alternatively, the electric work machine may include a second power-supply circuit. The second power-supply circuit may generate the second electric power from the AC power. The second power-supply circuit may be configured to supply the generated second electric power to the power-supply control circuit.

In a case where an electric work machine in one embodiment includes the above-described first current path, the above-described motor, the above-described driving mechanism, the above-described motor driving circuit, the above-described first power-supply circuit, the above-described power-supply control circuit, and the above-described second power-supply circuit, such an electric work machine enables reduction of heat generation in the first power-supply circuit.

In the power tool disclosed in Japanese Unexamined Patent Application Publication No. 2009-012149, the power supplier supplies the power-supply power to the motor control IC regardless of whether the motor is being driven. Thus, a failure caused by heat generation in the power supplier may occur in the power tool, or it may become necessary, in the power tool, to take measures to reduce heat generation in the power supplier. Accordingly, in this power tool, it is desirable to be able to reduce heat generation in the power supplier. On the other hand, the above-described electric work machine enables reduction of heat generation in the first power-supply circuit.

Additionally or alternatively, the first power-supply circuit may be configured to stop consumption of the AC power in the first power-supply circuit in response to input of the power-supply control signal having been stopped. In a case where an electric work machine in one embodiment includes the first power-supply circuit having this feature, such an electric work machine enables further reduction of heat generation in the first power-supply circuit.

Additionally or alternatively, the first power-supply circuit may include a second current path. The second current path may be connected to the first current path. The second current path may be configured to receive an electric current of the AC power from the first current path.

Additionally or alternatively, the first power-supply circuit may include a power-supply drive switch. The power-supply drive switch may be arranged on the second current path. The power-supply drive switch may be configured to receive the power-supply control signal. The power-supply drive switch may be configured to complete the second current path in response to having received or receiving the power-supply control signal. The power-supply drive switch may be configured to interrupt the second current path in response to input of the power-supply control signal having been stopped.

In a case where an electric work machine in one embodiment includes the first power-supply circuit having the above-described feature, such an electric work machine makes it possible to achieve reduction of heat generation in the first power-supply circuit with the simple configuration.

Additionally or alternatively, the power-supply drive switch may be configured to interrupt the second current path in response to establishment of a specified interruption condition during the power-supply drive switch keeping the second current path completed. The specified interruption condition may be established in response to the voltage of the AC power becoming zero or nearly zero (e.g., the value of the voltage is less than a lower limit).

More specifically, the power-supply drive switch may be in the form of a bidirectional thyristor (or a triac), for example. Such a power-supply drive switch keeps the second current path completed during an electric current of a specified level or more flowing through the power-supply drive switch, even when the power-supply control signal to the power-supply drive switch is stopped after the second current path is completed following receipt of the power-supply control signal. The power-supply drive switch, which keeps the second current path completed, interrupts the second current path when the electric current flowing through the power-supply drive switch becomes zero or nearly zero (e.g., the value of the electric current is less than 1).

In a case where an electric work machine in one embodiment includes the power-supply drive switch having the above-described feature, such an electric work machine makes it possible to easily interrupt supply of the AC power to the first power-supply circuit.

Additionally or alternatively, the power-supply control signal may include a pulse. In a case where an electric work machine in one embodiment is configured to output such a power-supply control signal, such an electric work machine makes it possible to easily control operation of the first power-supply circuit, that is, power consumption by the first power-supply circuit.

Additionally or alternatively, the electric work machine may include a zero-crossing detection circuit. The zero-crossing detection circuit may be configured to detect a zero-crossing of the voltage or electric current of the AC power. The zero-crossing may include at least a rising zero-crossing of the voltage or electric current of the AC power. Additionally or alternatively, the power-supply control signal may include a period signal. The period signal may be outputted for a first period of time, each time at least the rising zero-crossing is detected by the zero-crossing detection circuit.

In a case where an electric work machine in one embodiment includes the above-described zero-crossing detection circuit and also is configured to output the above-described power-supply control signal, such an electric work machine produces the following effect: specifically, the turned-OFF power-supply drive switch can be turned ON again each time at least the rising zero-crossing occurs.

Additionally or alternatively, the period signal may include two or more pulses. The two or more pulses may be periodically generated (or outputted) at regular intervals. In a case where an electric work machine in one embodiment is configured to output such a period signal, such an electric work machine makes it possible to turn ON the power-supply drive switch properly while reducing power consumption required to output the power-supply control signal.

Additionally or alternatively, the power-supply control circuit may be configured to output the period signal after elapse of a second period of time from when the zero-crossing is detected by the zero-crossing detection circuit. When the zero-crossing is detected or during a period shortly after such detection, the value of an AC voltage applied to the power-supply drive switch is low. Thus, even when the power-supply control signal is inputted to the power-supply drive switch, the power-supply drive switch may not be turned ON. To cope with this, the period signal is outputted after elapse of the second period of time from when the zero-crossing is detected, to thereby enable reduction of power consumption required to output the power-supply control signal in the power-supply control circuit.

Additionally or alternatively, the electric work machine may include a manual switch. The manual switch may be arranged on the first current path. The manual switch may be configured to complete or interrupt the first current path in accordance with manual operation by a user of the electric work machine. Additionally or alternatively, the zero-crossing detection circuit may be configured to receive the AC power via a part between the manual switch and the motor, on the first current path. In a case where an electric work machine in one embodiment includes the above-described manual switch and the above-described zero-crossing detection circuit, the zero-crossing detection circuit does not detect the zero-crossing during the first current path being interrupted by the manual switch. That is, the power-supply control signal is not outputted during the first current path being interrupted by the manual switch. Thus, such an electric work machine makes it possible to reduce consumption of the AC power by the first power-supply circuit during the first current path being interrupted by the manual switch (i.e., during the AC power to the motor being interrupted).

Additionally or alternatively, the first power-supply circuit may be connected to the fourth part. The fourth part corresponds to the part between the manual switch and the motor, on the first current path. The first power-supply circuit may be configured to receive the AC power via the fourth part. In a case where an electric work machine in one embodiment includes the above-described manual switch and the above-described first power-supply circuit, the AC power is not supplied to the first power-supply circuit during the first current path being interrupted by the manual switch. Thus, such an electric work machine makes it possible to efficiently reduce consumption of the AC power by the first power-supply circuit during the first current path being interrupted by the manual switch (i.e., during the AC power to the motor being interrupted).

Additionally or alternatively, the second power-supply circuit may be connected to a fifth part. The fifth part corresponds to a part closer to the AC power supply than the manual switch is, on the first current path. The second power-supply circuit may receive the AC power via the fifth part and may generate the second electric power from the AC power. In a case where an electric work machine in one embodiment includes the second power-supply circuit having this feature, the power-supply control circuit is operable regardless of the state of the manual switch. Thus, the power-supply control circuit can control the first power-supply circuit properly regardless of the state of the manual switch.

Additionally or alternatively, the driving requirement may be satisfied in response to the first current path being completed by the manual switch after activation of the power-supply control circuit. In a case where an electric work machine in one embodiment has such a driving requirement, such an electric work machine makes it possible to operate the first power-supply circuit to thereby supply the first electric power to the motor driving circuit, in accordance with the user's intention to drive the motor.

Additionally or alternatively, the motor driving circuit may include a motor drive switch. The motor drive switch may be arranged on the first current path. The motor drive switch may be configured to receive a motor drive signal. The motor drive switch may be configured to complete or interrupt the first current path in accordance with the motor drive signal.

Additionally or alternatively, the motor driving circuit may include a motor control circuit. The motor control circuit may be configured to receive the first electric power.

The motor control circuit may be configured to be activated by receiving the first electric power and to generate the motor drive signal.

In a case where an electric work machine in one embodiment includes the motor driving circuit having the above-described feature, such an electric work machine makes it possible to control power supply to the motor easily and efficiently with the simple configuration.

The motor drive switch may be in the form of a bidirectional thyristor, for example. The motor driving circuit including such a motor drive switch can efficiently control supply of the AC power to the motor.

Additionally or alternatively, the electric work machine may include a signal output circuit. The signal output circuit may be configured to output a speed signal corresponding to a rotational speed of the motor. Additionally or alternatively, the motor control circuit may be configured to perform a first process. The first process may include acquiring a target speed indicating a target of the rotational speed. Additionally or alternatively, the motor control circuit may be configured to perform a second process. The second process may include generating the motor drive signal based on the rotational speed indicated by the speed signal outputted from the signal output circuit and on the target speed acquired by the first process. Specifically, the second process may include generating the motor drive signal such that the rotational speed coincides with the target speed.

In a case where an electric work machine in one embodiment includes the above-described signal output circuit and the above-described motor control circuit, such an electric work machine enables proper control of the rotational speed of the motor.

Additionally or alternatively, the electric work machine may include a circuit board. The circuit board includes a board (or plate member) and the first power-supply circuit. The first power-supply circuit is mounted on the board. The first power-supply circuit includes an electronic component that may cause heat loss. Additionally or alternatively, the electric work machine may include a heat dissipation member. A heat generated from the circuit board is conducted to the heat dissipation member. The heat dissipation member dissipates the heat conducted from the circuit board. The heat dissipation member may include a first heat dissipation plate and/or a second heat dissipation plate. The first heat dissipation plate is a plate-shaped member that is parallel to the board and spaced from the board by a first distance. The second heat dissipation plate is a plate-shaped member that is parallel to the board and spaced from the board by a second distance. The second heat dissipation plate is thermally coupled with the first heat dissipation plate. The second distance is smaller than the first distance.

Additionally or alternatively, the electronic component may include a resistor. Additionally or alternatively, the second heat dissipation plate may be arranged such that the electronic component is present in an area facing the second heat dissipation plate, on a surface of the board.

In one embodiment, the above-described features may be combined in any manner. In one embodiment, any of the above-described features may be excluded.

2. Specific Exemplary Embodiment

(2-1) Overview of Electric Work Machine

As shown in FIG. 1, an electric work machine 1 of the present embodiment is in the form of a grinder (or hand-held grinder), for example. The grinder is able to perform grinding, cutting, and other process to a workpiece of metal, concrete, wood, or other material. The electric work machine 1 receives AC power from an AC power supply 100 (see FIG. 2) external to the electric work machine 1. The electric work machine 1 is driven with the AC power. The AC power supply 100 may have any form. The AC power supply 100 may be configured to supply, for example, an AC power of utility power (or general-purpose AC electric supply) having 100 volts (V), or 120 V to 230V.

The electric work machine 1 includes a motor housing 2. The motor housing 2 has a cylindrical shape. The motor housing 2 houses a motor 15 (see FIG. 2).

The motor 15 includes a rotor including a shaft. A rotational axis of the motor 15 (i.e., a rotational axis of the rotor or of the shaft) is parallel to and corresponds substantially to a central axis of the motor housing 2.

The electric work machine 1 further includes a rear housing 3. The rear housing 3 is arranged at a first end (e.g., a rear end) of the motor housing 2. The rear housing 3 is gripped by a user of the electric work machine 1.

The electric work machine 1 further includes a power cord 12. The power cord 12 extends from a first end (e.g., a rear end) of the rear housing 3. In other words, a first end of the power cord 12 is connected to the rear housing 3. Provided at a second end of the power cord 12 is a power plug 14 (see FIG. 2). In response to the power plug 14 being connected to the AC power supply 100, the AC power of the AC power supply 100 is supplied to the electric work machine 1 via the power cord 12.

The electric work machine 1 further includes a gear housing 4. The gear housing 4 is arranged at a second end (e.g., a front end) of the motor housing 2. The shaft of the motor 15 protrudes toward the gear housing 4.

The gear housing 4 includes a spindle 5. The spindle 5 is rotatably supported by the gear housing 4 via a bearing (not shown). For example in the present embodiment, the spindle 5 protrudes in a direction perpendicular to the rotational axis of the motor 15. That is, in the present embodiment, a rotational axis of the spindle 5 is perpendicular to the rotational axis of the motor 15.

An inner flange 6 is provided to the spindle 5. A grinding wheel 9 is detachably attached to the inner flange 6. The grinding wheel 9 performs grinding, cutting, and other processing on the workpiece. The grinding wheel 9 may be in the form of a disk-shaped grinding stone or cutter, for example. A leading end part of the spindle 5 is screwed into a lock nut 7. The lock nut 7 fixes the grinding wheel 9 to the inner flange 6, and inhibits the grinding wheel 9 from falling off from the inner flange 6. The grinding wheel 9 is clamped between the lock nut 7 and the inner flange 6. The grinding wheel 9 may be fixed to the electric work machine 1 in an undetachable manner.

The gear housing 4 houses a transmission mechanism (not shown). The transmission mechanism transmits a rotational force of the motor 15 to the spindle 5. The spindle 5 rotates with the rotational force of the motor 15 transmitted via the transmission mechanism. Accordingly, when the rotational force of the motor 15 is transmitted to the spindle 5, to which the grinding wheel 9 is attached, the grinding wheel 9 rotates together with the spindle 5. In other words, the spindle 5 transmits the rotational force of the motor 15 to the grinding wheel 9.

The electric work machine 1 further includes a wheel cover 8. The wheel cover 8 is attached to the gear housing 4. The wheel cover 8 protects the user from scattered fragments of the workpiece and of the grinding wheel 9 generated at the time of operation by the grinding wheel 9. The wheel cover 8 of the present embodiment has, for example, a substantially semicircular shape. The wheel cover 8 of the present embodiment is configured to cover a part (e.g., substantially a half) of the grinding wheel 9 fixed to the spindle 5, on the side where the gear housing 4 is present.

The electric work machine 1 further includes a handle 10. In the present embodiment, the handle 10 is, for example, attached to the gear housing 4 in a detachable manner. More specifically, in the present embodiment, the handle 10 protrudes, for example, from a side surface of the gear housing 4 in a direction perpendicular both to the rotational axis of the motor 15 and to the rotational axis of the spindle 5.

The handle 10 is gripped by the user. For example, the user can use the electric work machine 1 with the rear housing 3 held in the right hand and with the handle 10 held in the left hand. The user can adjust a position of the grinding wheel 9 relative to the workpiece via the handle 10.

The electric work machine 1 further includes a main switch 11. For example in the present embodiment, the main switch 11 is arranged on the rear housing 3. The main switch 11 is manually operated by the user. Specifically, the main switch 11 is turned ON or OFF by such manual operation of the user. The main switch 11 of the present embodiment is configured to perform a momentary operation, for example. Specifically, the main switch 11 is ON while being manually operated (e.g., while being pulled) by the user, and is OFF while not being manually operated by the user. While the main switch 11 is OFF, the motor 15 is at a stop. The motor 15 rotates in response to turning-ON of the main switch 11. In the present embodiment, however, there is a case where turning-ON of the main switch 11 does not result in rotation of the motor 15.

The main switch 11 may be arranged on a part other than the rear housing 3. The main switch 11 may be arranged, for example, on the motor housing 2. The main switch 11 may be configured to perform an operation different from the momentary operation. Specifically, the main switch 11 may perform, for example, an alternate operation. The main switch 11 may have a form different from a trigger type as described above. Specifically, the main switch 11 may be in the form of a push-button switch or may be in the form of a slide switch, for example.

(2-2) Electrical Configuration of Electric Work Machine

Figure 2:
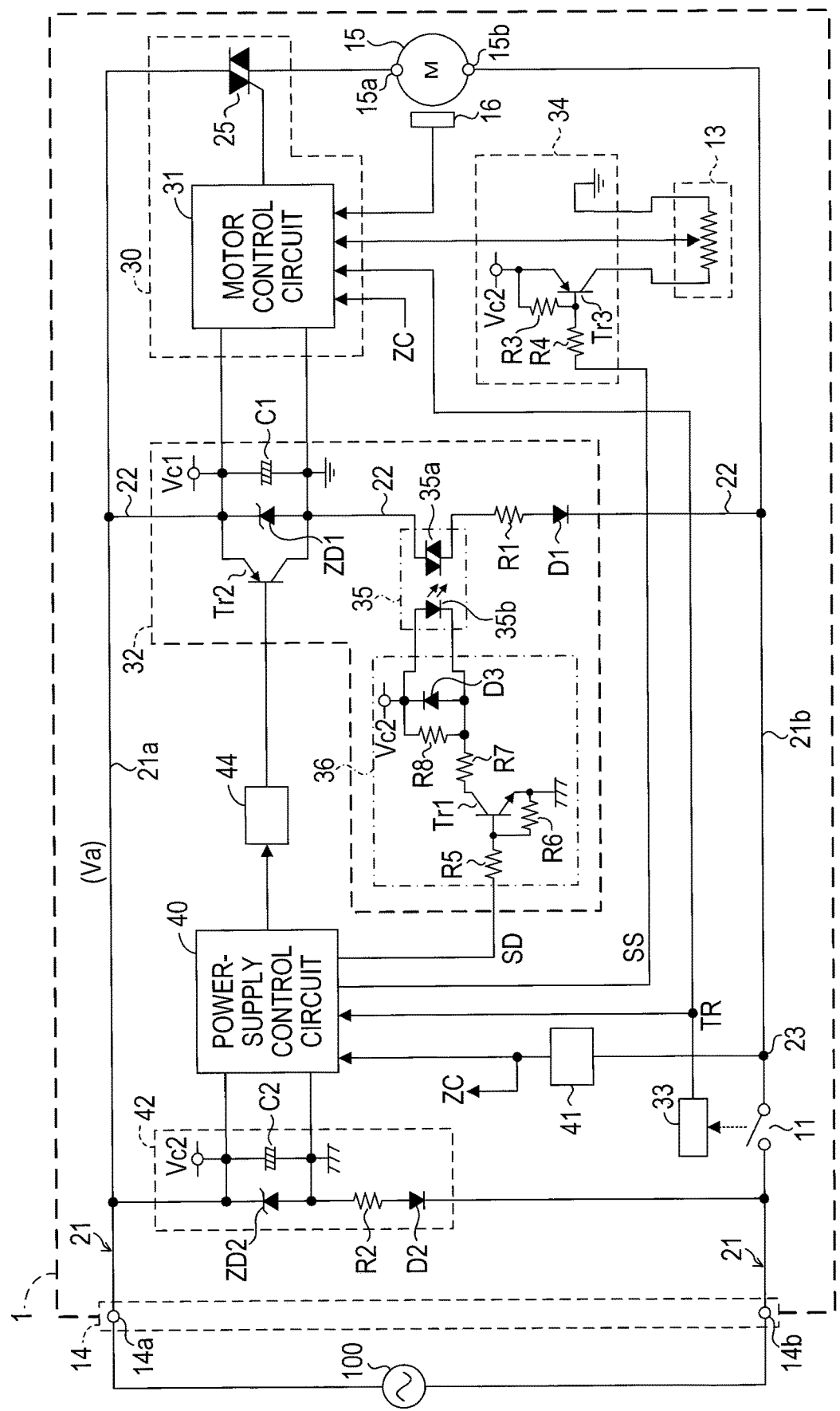
FIG. 2 is an explanatory diagram showing a configuration of an electrical system of the electric work machine.

As shown in FIG. 2, the electric work machine 1 receives the AC power from the AC power supply 100. Specifically, the electric work machine 1 of the present embodiment includes the above-described power plug 14. The power plug 14 includes a first input terminal 14a and a second input terminal 14b. When the power plug 14 is connected to the AC power supply 100, the AC power is supplied into the electric work machine 1 from the AC power supply 100 via the first input terminal 14a and the second input terminal 14b.

The electric work machine 1 includes a first current path 21 and the above-described motor 15. For example in the present embodiment, the motor 15 is in the form of a brushed AC motor. The AC power is supplied to the motor 15 from the power plug 14 through the first current path 21. The motor 15 is driven with the AC power. The motor 15 may be any type of motor configured to rotate with AC power.

A first end of the first current path 21 is connected to the first input terminal 14a. A second end of the first current path 21 is connected to the second input terminal 14b. The first current path 21 is supplied with the AC power from the AC power supply 100 via the power plug 14.

The motor 15 is arranged on the first current path 21. The motor 15 includes a first terminal 15a and a second terminal 15b. The motor 15 receives the AC power via the first terminal 15a and the second terminal 15b.

More specifically, the first current path 21 includes a first path 21a and a second path 21b. A first end of the first path 21a corresponds to the first end of the first current path 21. That is, the first end of the first path 21a is connected to the first input terminal 14a. The second end of the first path 21a is connected to the first terminal 15a of the motor 15.

A first end of the second path 21b corresponds to the second end of the first current path 21. That is, the first end of the second path 21b is connected to the second input terminal 14b. A second end of the second path 21b is connected to the second terminal 15b of the motor 15.

As shown in FIG. 2, the above-described main switch 11 is arranged on the first current path 21 from an electrical point of view. More specifically, in the present embodiment, the main switch 11 is arranged on the second path 21b. That is, a first end of the main switch 11 is connected to the second input terminal 14b, and a second end of the main switch 11 is connected to the second terminal 15b of the motor 15. The main switch 11 may be arranged on the first path 21a.

The main switch 11 is manually moved by the user. The main switch 11 completes or interrupts the first current path 21. Specifically, when the main switch 11 is manually turned ON, the main switch 11 completes the first current path 21. When the manual operation of the user is stopped to thereby turn OFF the main switch 11, the main switch 11 interrupts the first current path 21.

The electric work machine 1 further includes a motor driving circuit 30. The motor driving circuit 30 supplies the AC power to the motor 15. In addition, the motor driving circuit 30 controls the AC power to be supplied to the motor 15.

The motor driving circuit 30 is activated and operated by receiving a first electric power. In other words, the first electric power is a power-supply power for the motor driving circuit 30 (to be specific, a power-supply power for a motor control circuit 31, which will be described below). The motor driving circuit 30 receives the first electric power from a first power-supply circuit 32, which will be described below.

The motor driving circuit 30 includes a motor drive switch 25 and the above-described motor control circuit 31. The motor drive switch 25 is arranged on the first current path 21. More specifically, in the present embodiment, the motor drive switch 25 is arranged on the first path 21a. The motor drive switch 25 may be arranged on the second path 21b.

The motor drive switch 25 receives a motor drive signal from the motor control circuit 31. The motor drive switch 25 completes or interrupts the first current path 21 in accordance with the motor drive signal.

In the present embodiment, the motor drive switch 25 is in the form of a triac (i.e., a bidirectional thyristor). In the present embodiment, a first end of the triac is connected to the first input terminal 14a. A second end of the triac is connected to the first terminal 15a of the motor 15. The second terminal 15b of the motor 15 is connected to the second input terminal 14b via the main switch 11. The motor drive signal is inputted to a gate (i.e., a control terminal) of the triac.

When the motor drive signal is inputted to the triac in a state where a specified bias is applied between the first end and the second end of the triac, the triac is turned ON (i.e., fired). When the triac is turned ON, the first current path 21 is completed. This causes the AC power from the AC power supply 100 to be supplied to the motor 15 via the triac.

After the triac is turned ON, when the value of a current flowing through the triac becomes less than a first lower limit, the triac is turned OFF (i.e., extinguished). When the triac is turned OFF, the first current path 21 is interrupted. This results in interruption of supply of the AC power from the AC power supply 100 to the motor 15. The first lower limit is the value of a minimum current required to keep the triac ON.

The motor control circuit 31 is activated by receiving the first electric power, and is operated with the first electric power. The motor control circuit 31 controls supply of the AC power to the motor 15. Specifically, the motor control circuit 31 generates the above-described motor drive signal. For example, the motor control circuit 31 may include a logic circuit including two or more electronic components, an IC, and so on, or may include an integrated circuit for a particular use, such as an Application Specific Integrated Circuit (ASIC) and/or an Application Specific Standard Product (ASSP), or may include a programmable logic device, such as a Field Programmable Gate Array (FPGA), capable of constructing any logic circuit, or may include a microcomputer.

The electric work machine 1 further includes a zero-crossing detection circuit 41. The zero-crossing detection circuit 41 detects a zero-crossing of voltage or electric current of the AC power inputted from the AC power supply 100. In the present embodiment, the zero-crossing detection circuit 41 detects a zero-crossing of an AC voltage. Specifically, the zero-crossing detection circuit 41 of the present embodiment is connected to a first connection point 23 on the first current path 21. The first connection point 23 is present between the main switch 11 and the second terminal 15b of the motor 15, on the second path 21b. The zero-crossing detection circuit 41 detects a zero-crossing of the voltage at the first connection point 23.

Figure 3:
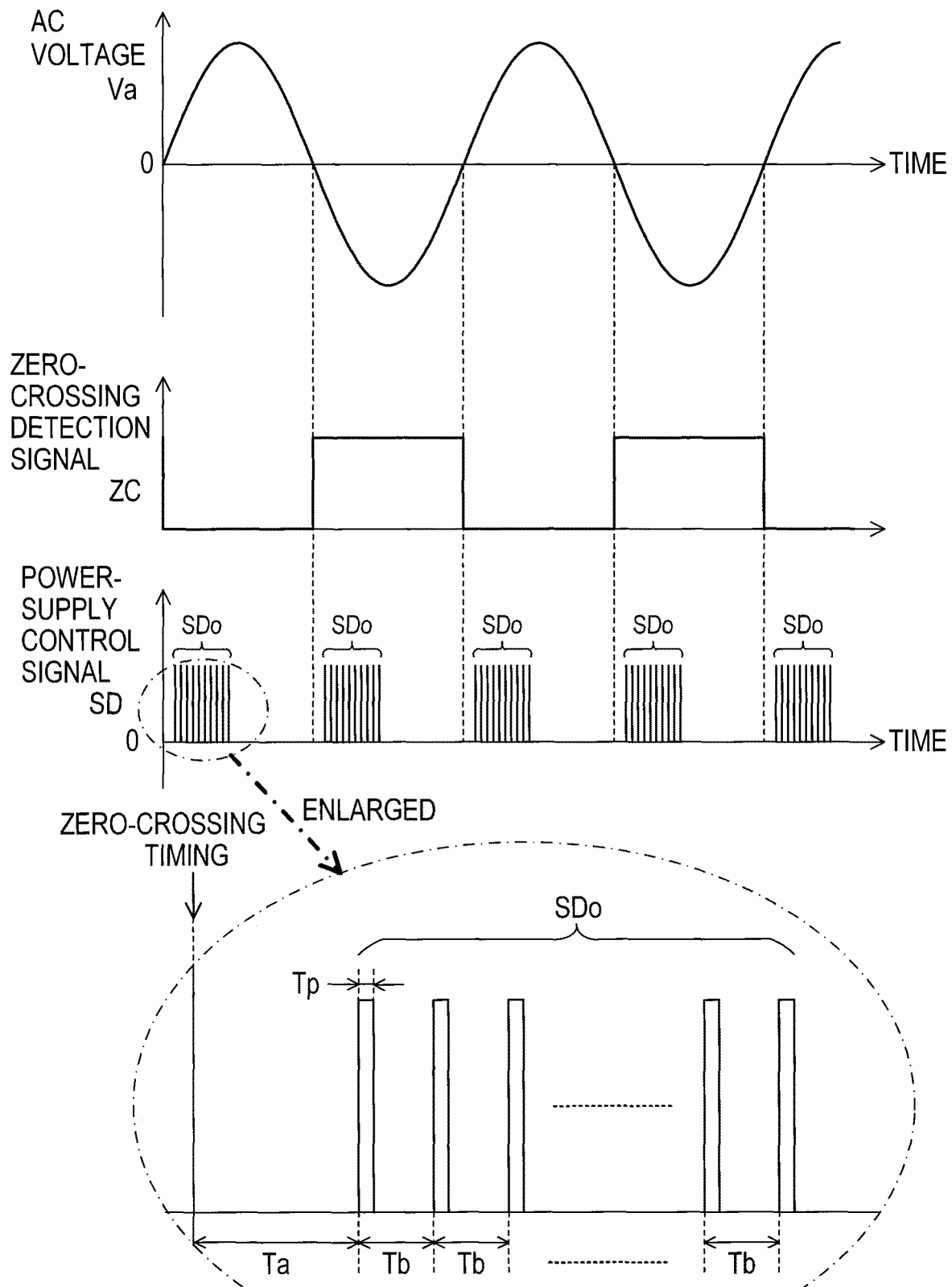
FIG. 3 is an explanatory diagram showing an example of a power-supply control signal.

The zero-crossing detection circuit 41 outputs a zero-crossing detection signal ZC. In the present embodiment, the zero-crossing detection signal ZC is a binary signal. That is, the signal level of the zero-crossing detection signal ZC is changed each time a zero-crossing occurs. As illustrated in FIG. 3, upon occurrence of a zero-crossing (a falling zero-crossing) at the time when an AC voltage Va shifts from a positive half-cycle to a negative half-cycle, the zero-crossing detection signal ZC turns to an H level. Upon occurrence of a zero-crossing (a rising zero-crossing) at the time when the AC voltage Va shifts from a negative half-cycle to a positive half-cycle, the zero-crossing detection signal ZC turns to an L level. The AC voltage Va refers to a voltage on the first path 21a and, more specifically, a voltage at the first input terminal 14a.

The voltage to be inputted to the zero-crossing detection circuit 41 is a voltage on the second path 21b. However, a timing when a zero-crossing timing occurs on the first path 21a and a timing when a zero-crossing occurs on the second path 21b are the same as each other. In other words, a positive half-cycle of the AC voltage Va corresponds to a negative half-cycle of the AC voltage on the second path 21b, and a negative half-cycle of the AC voltage Va corresponds to a positive half-cycle of the AC voltage on the second path 21b. Thus, for explanatory convenience, FIG. 3 shows a relationship between the zero-crossing timing of the AC voltage Va and the zero-crossing detection signal ZC.

The zero-crossing detection signal ZC is inputted to the motor control circuit 31 and to a power-supply control circuit 40, which will be described below.

The zero-crossing detection circuit 41 may detect a zero-crossing of an AC current of the AC power. The zero-crossing detection circuit 41 may detect both of the rising zero-crossing and the falling zero-crossing of a detection-target AC voltage or AC current, or may detect either of the rising zero-crossing or the falling zero-crossing.

The electric work machine 1 further includes the first power-supply circuit 32. The first power-supply circuit 32 generates the above-described first electric power. The first electric power causes the motor driving circuit 30 to operate (to be specific, causes the motor control circuit 31 to operate). The first power-supply circuit 32 is connected to the first current path 21, and receives the AC power from the first current path 21.

Further, the first power-supply circuit 32 receives a power-supply control signal SD from the power-supply control circuit 40. In response to receiving the power-supply control signal SD, the first power-supply circuit 32 generates the first electric power from the AC power. In response to stop of input of the power-supply control signal SD, the first power-supply circuit 32 stops generation of the first electric power. More specifically, in response to stop of input of the power-supply control signal SD, the first power-supply circuit 32 of the present embodiment stops consumption of the AC power in the first power-supply circuit 32. The first electric power is a DC power. The first electric power has a first voltage Vc1 of direct current. Strictly speaking, the first voltage Vc1 may pulsate, but can be handled as a DC voltage.

The first power-supply circuit 32 of the present embodiment includes a triac coupler as will be described below. In the present embodiment, due to a function (or electrical properties) of the triac coupler, stop of input of the power-supply control signal SD does not immediately cause the first power-supply circuit 32 to stop generation of the first electric power. In the present embodiment, the first power-supply circuit 32 generating the first electric power stops generation of the first electric power in accordance with a phase of the AC current inputted.

The first power-supply circuit 32 includes a second current path 22. The second current path 22 is connected to the first current path 21. The first power-supply circuit 32 receives the AC power from the first current path 21 through the second current path 22.

Specifically, a first end of the second current path 22 is connected to the first path 21a. A second end of the second current path 22 is connected to the second path 21b. More specifically, the second end of the second current path 22 is connected between the main switch 11 and the second terminal 15b of the motor 15, on the second path 21b. Thus, the first power-supply circuit 32 receives the AC power while the main switch 11 is ON. The first power-supply circuit 32 does not receive the AC power while the main switch 11 is OFF.

The first power-supply circuit 32 further includes a first Zener diode ZD1, a power-supply drive switch 35, and a first diode D1. The first Zener diode ZD1, the power-supply drive switch 35, and the first diode D1 are arranged on the second current path 22.

A cathode of the first Zener diode ZD1 is connected to the first path 21a, and receives the AC voltage from the AC power supply 100. An anode of the first Zener diode ZD1 is connected to a first end of the power-supply drive switch 35. A second end of the power-supply drive switch 35 is connected to an anode of the first diode D1. In the present embodiment, a resistor R1 is connected between the power-supply drive switch 35 and the first diode D1. The second end of the power-supply drive switch 35 is connected to the anode of the first diode D1 via the resistor R1. A cathode of the first diode D1 is connected to the second path 21b.

The first power-supply circuit 32 further includes a first capacitor C1. A first end of the first capacitor C1 is connected to the cathode of the first Zener diode ZD1. A second end of the first capacitor C1 is connected to the anode of the first Zener diode ZD1. The first electric power is generated mainly by the first Zener diode ZD1 and the first capacitor C1.

The power-supply drive switch 35 of the present embodiment receives the power-supply control signal SD in an indirect manner. Specifically, the first power-supply circuit 32 includes a first drive circuit 36. In the present embodiment, it is the first drive circuit 36 that the power-supply control signal SD is directly inputted to. In response to receiving the power-supply control signal SD, the first drive circuit 36 outputs a power-supply drive signal corresponding to the power-supply control signal SD. This power-supply drive signal is inputted to the power-supply drive switch 35.

In response to receiving the power-supply drive signal from the first drive circuit 36 (i.e., indirectly receiving the power-supply control signal SD), the power-supply drive switch 35 is turned ON, thus completing the second current path 22. The power-supply drive switch 35 interrupts the second current path 22 in response to stop of input of the power-supply drive signal.

In the present embodiment, the power-supply drive switch 35 is a so-called triac coupler (or opto-isolated triac). Thus, in the present embodiment, the power-supply control signal SD is generated with consideration of properties of the triac coupler. Due to the properties of the triac coupler, stop of input of the power-supply control signal SD does not immediately results in turning-OFF of the triac coupler. A timing when the triac coupler is turned OFF (i.e., a timing when the second current path 22 is interrupted) depends on a phase of the AC current flowing through the triac coupler.

The power-supply drive switch 35 of the present embodiment will be described in detail. The power-supply drive switch 35 includes an optical coupler. Specifically, in the present embodiment, the power-supply drive switch 35 includes an opto-triac (or a photo-triac) 35a and an LED 35b.

Similarly to general triacs, the opto-triac 35a basically has a function of controlling electric current flowing in either direction. However, the opto-triac 35a is turned ON (i.e., fired) by receiving light from the LED 35b. Specifically, the opto-triac 35a includes a light-receiving surface (e.g., a P-N junction) that receives the light from the LED 35b. This light-receiving surface and the LED 35b function as the opto-coupler (or a photo-coupler).

The opto-triac 35a is arranged on the second current path 22, and completes or interrupts the second current path 22. The above-described first end of the power-supply drive switch 35 corresponds to a first end of the opto-triac 35a. The above-described second end of the power-supply drive switch 35 corresponds to a second end of the opto-triac 35a.

When the light-receiving surface of the opto-triac 35a receives the light from the LED 35b in a state where a bias of a specified level or more is applied between the first end and the second end of the opto-triac 35a, the opto-triac 35a is turned ON (i.e., fired), thus completing the second current path 22. This causes the AC current to be inputted to the first power-supply circuit 32 from the AC power supply 100 through the second current path 22. Then, the first electric power is generated by the first Zener diode ZD1 and the first capacitor C1.

While the first electric power is being generated, that is, while the opto-triac 35a is ON, when the value of a current flowing through the opto-triac 35a becomes less than a second lower limit, the opto-triac 35a is turned OFF (i.e., cut off or extinguished). When the opto-triac 35a is turned OFF, the second current path 22 is interrupted. This stops input of the AC current to the first power-supply circuit 32 from the AC power supply 100, and power consumption by the first power-supply circuit 32 becomes zero or nearly zero. The second lower limit is the value of a minimum current required to keep the opto-triac 35a ON.

The power-supply drive switch 35 receives the power-supply drive signal from the first drive circuit 36. The power-supply drive signal has the same phase as the power-supply control signal SD. Further, the power-supply drive signal has an electric current capable of lighting up the LED 35b.

The first drive circuit 36 includes a first transistor Tr1 of NPN type. A base of the first transistor Tr1 is connected to a resistor R5. The base of the first transistor Tr1 receives the power-supply control signal SD from the power-supply control circuit 40 via the resistor R5. The base of the first transistor Tr1 is connected to an emitter of the first transistor Tr1 via a resistor R6. The emitter of the first transistor Tr1 is connected to a first ground line. A collector of the first transistor Tr1 is connected to a first end of a resistor R7. A second end of the resistor R7 is connected to a cathode of the LED 35b. The second end of the resistor R7 is further connected to a first end of a resistor R8. A second end of the resistor R8 receives a second voltage Vc2 generated by a second power-supply circuit 42, which will be described below. The second end of the resistor R8 is further connected to an anode of the LED 35b. Further, a third diode D3 is connected in parallel to the resistor R8. An anode of the third diode D3 is connected to the first end of the resistor R8. A cathode of the third diode D3 is connected to the second end of the resistor R8.

In the first drive circuit 36 configured as described above, the first transistor Tr1 is OFF while the first drive circuit 36 is not receiving the power-supply control signal SD. Thus, the LED 35b is not supplied with the electric current from the first drive circuit 36, thus turning OFF the power-supply drive switch 35. By contrast, when the first drive circuit 36 receives the power-supply control signal SD, the first transistor Tr1 is turned ON. This allows the electric current to flow from the first drive circuit 36 to the LED 35b, and the LED 35b emits light. When the LED 35b emits light in a state where a bias of a specified level or more is applied to the opto-triac 35a, the opto-triac 35a is turned ON (i.e., the power-supply drive switch 35 is turned ON).

As illustrated in FIG. 3, the power-supply control signal SD of the present embodiment includes a period signal SDo. The period signal SDo is outputted in each half cycle of the AC voltage Va. Specifically, the period signal SDo is outputted each time a zero-crossing is detected by the zero-crossing detection circuit 41. In more detail, in the present embodiment, the power-supply control circuit 40 outputs the period signal SDo after a standby time Ta has elapsed from the zero-crossing timing. The zero-crossing timing corresponds to a timing when the zero-crossing is detected by the zero-crossing detection circuit 41. The zero-crossing includes a rising zero-crossing and a falling zero-crossing. The power-supply control circuit 40 of the present embodiment outputs the period signal SDo in response to detection of the rising zero-crossing, and also outputs the period signal SDo in response to detection of the falling zero-crossing.

The standby time Ta is determined in advance with consideration of a time required from the timing when the zero-crossing is detected until when the bias of a specified level or more is applied to the opto-triac 35a. The standby time Ta may be, for example, a time longer than or equal to the time required and also shorter than the half cycle of the AC voltage.

As illustrated in FIG. 3, the period signal SDo includes two or more pulses. Each of the two or more pulses has a pulse width Tp. The two or more pulses are periodically outputted at regular intervals Tb. Each of the two or more pulses is able to cause the LED 35b of the power-supply drive switch 35 to emit light. In other words, input of even one pulse to the first drive circuit 36 causes the power-supply drive signal corresponding to the pulse to be supplied from the first drive circuit 36 to the LED 35b, thus causing the LED 35b to emit light.

Accordingly, the period signal SDo does not necessarily have to have two or more pulses. The period signal SDo may have at least one pulse. However, the period signal SDo of the present embodiment includes the two or more pulses in order to reliably turn ON the power-supply drive switch 35 at a timing when the same should be turned ON.

The first power-supply circuit 32 further includes a second transistor Tr2 of PNP type. An emitter of the second transistor Tr2 is connected to the cathode of the first Zener diode ZD1. A collector of the second transistor Tr2 is connected to the anode of the first Zener diode ZD1. A base of the second transistor Tr2 receives a drive signal from a second drive circuit 44.

The second drive circuit 44 outputs the drive signal in response to receiving a short-circuit command from the power-supply control circuit 40. When the drive signal is inputted to the base of the second transistor Tr2, the second transistor Tr2 is turned ON. When the second transistor Tr2 is turned ON, a short circuit between the anode and the cathode of the first Zener diode ZD1 is caused by the second transistor Tr2. This results in stopping generation of the first electric power (i.e., generation of the first voltage Vc1). The stop of generation of the first electric power causes the motor control circuit 31 to stop operation. As a result, the motor drive switch 25 is kept OFF, and the motor 15 is stopped. That is, the power-supply control circuit 40 can forcibly stop the motor 15 by outputting the short-circuit command.

The electric work machine 1 further includes a switch detection circuit 33. The switch detection circuit 33 detects a state of the main switch 11. The switch detection circuit 33 outputs a switch detection signal TR indicating the detected state of the main switch 11. The switch detection signal TR is inputted to the power-supply control circuit 40 and to the motor control circuit 31.

The electric work machine 1 further includes the above-described power-supply control circuit 40. The power-supply control circuit 40 is activated by receiving a second electric power, and is operated with the second electric power. The power-supply control circuit 40 outputs the power-supply control signal SD to the first power-supply circuit 32 in response to satisfaction of a driving requirement. The power-supply control circuit 40 stops output of the power-supply control signal SD in response to non-satisfaction of the driving requirement. The power-supply control circuit 40 of the present embodiment includes, for example, a CPU and a memory. The memory may include, for example, a semiconductor memory, such as a ROM, a RAM, an NVRAM, or a flash memory. That is, the power-supply control circuit 40 of the present embodiment includes a microcomputer. The power-supply control circuit 40 performs various functions by executing a program stored in a non-transitory tangible storage medium. In the present embodiment, the memory corresponds to the non-transitory tangible storage medium in which the program is stored. In the present embodiment, the memory stores a program for a power-supply control process (see FIG. 4), which will be described below. Some or all of the various functions performed by the power-supply control circuit 40 may be performed by execution of the program (i.e., by software processing), or may be performed by one or more hardware processors. For example, instead of the microcomputer or in addition to the microcomputer, the power-supply control circuit 40 may include a logic circuit including two or more electronic components, or may include an integrated circuit for a particular use, such as an ASIC and/or an ASSP, or may include a programmable logic device, such as an FPGA, capable of constructing any logic circuit.

The power-supply control circuit 40 receives the zero-crossing detection signal ZC from the zero-crossing detection circuit 41. The power-supply control circuit 40 further receives the switch detection signal TR from the switch detection circuit 33. The power-supply control circuit 40 can detect a zero-crossing of the AC voltage based on the zero-crossing detection signal ZC. The power-supply control circuit 40 can detect whether the main switch 11 is ON based on the switch detection signal TR.

The driving requirement is satisfied in response to, for example, the main switch 11 being ON. Specifically, while the main switch 11 is ON, the power-supply control circuit 40 outputs the power-supply control signal SD illustrated in FIG. 3 based on the zero-crossing detection signal ZC. The power-supply control signal SD illustrated in FIG. 3 is one example. The power-supply drive switch 35 may be turned ON by a power-supply control signal different from the power-supply control signal SD illustrated in FIG. 3.

Here, a first half-cycle and a second half-cycle in one cycle of the AC current inputted from the AC power supply 100 will be defined. The first half-cycle corresponds to a period in which a voltage at the first input terminal 14a is higher than a voltage at the second input terminal 14b. The second half-cycle corresponds to a period in which the voltage at the second input terminal 14b is higher than the voltage at the first input terminal 14a.

In the first half-cycle, when the power-supply drive switch 35 is turned ON, the AC current is inputted to the first power-supply circuit 32. Meanwhile, the first power-supply circuit 32 of the present embodiment includes the first diode D1. Thus, in the second half-cycle, turning-ON of the power-supply drive switch 35 does not results in input of the AC current to the first power-supply circuit 32. That is, in the present embodiment, the first power-supply circuit 32 basically receives the AC current in the first half-cycle, and does not receive the AC current in the second half-cycle. In other words, the first diode D1 rectifies (e.g., half-wave rectifies) the AC current inputted to the first power-supply circuit 32. This results in conversion, to a DC voltage, of the AC voltage inputted to the first power-supply circuit 32 from the AC power supply 100. The DC voltage is stepped down by the resistor R1. The DC voltage stepped down by the resistor R1 is applied to the first capacitor C1.

Accordingly, when a zero-crossing is detected, if the zero-crossing corresponds to the beginning of the second half-cycle, the power-supply control circuit 40 need not output the period signal SDo. In other words, the power-supply control circuit 40 may output the period signal SDo to turn ON the power-supply drive switch 35 only when a zero-crossing corresponding to the beginning of the first half-cycle is detected. In this case, power consumption in the power-supply control circuit 40 for generation and output of the power-supply control signal SD is reduced.

The electric work machine 1 further includes the second power-supply circuit 42. The second power-supply circuit 42 receives the AC power from the AC power supply 100, and generates the second electric power from the AC power. The second power-supply circuit 42 supplies the second electric power to the power-supply control circuit 40. The second electric power is a DC power. The second electric power has the second voltage Vc2 of direct current. Strictly speaking, the second voltage Vc2 may pulsate, but can be handled as a DC voltage.

In the present embodiment, the second power-supply circuit 42 is connected to the first current path 21. Specifically, the second power-supply circuit 42 is connected to the first path 21a. The second power-supply circuit 42 receives the AC power from the AC power supply 100. The second power-supply circuit 42 is further connected between the main switch 11 and the second input terminal 14b, on the second path 21b. Thus, the second power-supply circuit 42 receives the AC power even when the main switch 11 is OFF.

The second power-supply circuit 42 includes a second Zener diode ZD2, a second capacitor C2, and a second diode D2. A cathode of the second Zener diode ZD2 is connected to the first path 21a, and receives the AC voltage from the AC power supply 100. An anode of the second Zener diode ZD2 is connected to an anode of the second diode D2 via a resistor R2. A cathode of the second diode D2 is connected to the second path 21b. A first end of the second capacitor C2 is connected to the cathode of the second Zener diode ZD2. A second end of the second capacitor C2 is connected to the anode of the second Zener diode ZD2. The second electric power is generated (i.e., the second voltage Vc2 is generated) mainly by the second Zener diode ZD2 and the second capacitor C2.

The electric work machine 1 further includes a rotation sensor 16. The rotation sensor 16 outputs a signal (hereinafter referred to as a "speed signal") corresponding to an actual rotational speed of the rotor of the motor 15. The speed signal is inputted to the motor control circuit 31.

The electric work machine 1 further includes a speed setting switch 13 and a setting speed detection circuit 34. The speed setting switch 13 is, for example, arranged on the motor housing 2 in a manner manually operable by the user. The speed setting switch 13 designates a target speed of the motor 15. In the present embodiment, the motor 15 is controlled to rotate at a constant rotational speed by the motor control circuit 31. Specifically, the motor control circuit 31 controls the rotational speed of the motor 15 such that the actual rotational speed coincides with the target speed designated with the speed setting switch 13.

For example in the present embodiment, the speed setting switch 13 is configured such that the target speed can be changed stepwise. Specifically, for example in the present embodiment, the speed setting switch 13 includes a dial (not shown). The target speed is changed according to a position of this dial. The user can designate any of two or more (e.g., five) setting speeds as the target speed by turning the dial. The electric work machine 1 may be configured such that the target speed can be continuously changed. Furthermore, the speed setting switch 13 may be a switch of a type different from the dial type.

The setting speed detection circuit 34 outputs a target speed signal to the motor control circuit 31. The target speed signal indicates the target speed designated with the speed setting switch 13. The motor control circuit 31 determines the target speed based on the target speed signal received from the setting speed detection circuit 34.

The speed setting switch 13 is a variable resistor (or a potentiometer). The setting speed detection circuit 34 is connected to a first end and a second end of this variable resistor. The setting speed detection circuit 34 includes a third transistor Tr3 of PNP type. The first end of the variable resistor is connected to a collector of the third transistor Tr3. An emitter of the third transistor Tr3 receives the second voltage Vc2. A base of the third transistor Tr3 is connected to the power-supply control circuit 40 via a resistor R4. The base of the third transistor Tr3 is connected to the emitter of the third transistor Tr3 via a resistor R3. The second end of the variable resistor is connected to a second ground line, within the setting speed detection circuit 34.

The base of the third transistor Tr3 can receive a setting disable signal SS from the power-supply control circuit 40. In a regular condition in which the third transistor Tr3 is not receiving the setting disable signal SS, the third transistor Tr3 is ON. In this case, a divided voltage value is inputted to the motor control circuit 31 as the target speed signal. The divided voltage value corresponds to a value obtained by dividing the second voltage Vc2 according to a state of the speed setting switch 13.

By contrast, when the third transistor Tr3 receives the setting disable signal SS, the third transistor Tr3 is turned OFF. In this case, the target speed signal becomes a zero signal regardless of the state of the speed setting switch 13. The zero signal has an electric potential of the second ground line. This zero signal means to designate the target speed to zero. In the case of receiving the zero signal from the setting speed detection circuit 34, the motor control circuit 31 stops the motor 15. In other words, the power-supply control circuit 40 can forcibly stop the motor 15 by outputting the setting disable signal SS.

The motor control circuit 31 performs a motor control process while the main switch 11 is ON. The motor control circuit 31 can determine whether the main switch 11 is ON by the switch detection signal TR. The motor control process is performed based on the zero-crossing detection signal ZC, a speed setting signal, and a speed signal. The motor control process includes a first process and a second process.

The first process includes acquiring the target speed based on the speed setting signal. The second process includes generating the motor drive signal based on the actual rotational speed indicated by the speed signal from the rotation sensor 16 and on the target speed acquired in the first process. Specifically, the second process includes generating the motor drive signal such that the actual rotational speed coincides with the target speed.

In the second process, in more detail, a so-called phase control is performed. Specifically, the motor drive switch 25 of the present embodiment includes the triac. After being turned ON, the triac is turned OFF in response to occurrence of a zero-crossing. Thus, each time the zero-crossing timing is detected via the zero-crossing detection signal ZC, the motor control circuit 31 outputs the motor drive signal to the motor drive switch 25 at a specified drive timing (at a so-called conduction angle). This results in turning ON the motor drive switch 25 at the drive timing. The conduction angle is determined with reference to the zero-crossing timing. The rotational speed of the motor 15 is determined according to the conduction angle.

(2-3) Power-Supply Control Process by Power-Supply Control Circuit

The power-supply control process performed by the power-supply control circuit 40 will be described with reference to FIG. 4. Upon being supplied with the second electric power and thereby activated, the power-supply control circuit 40 (in more detail, the above-described CPU, for example) performs the power-supply control process.

Upon starting the power-supply control process, the power-supply control circuit 40 determines, in S110, whether the main switch 11 is ON. Such a determination can be made based on the switch detection signal TR. If the main switch 11 is OFF, the present process proceeds to S120.

If the main switch 11 is ON, the power-supply control circuit 40 performs a process of S160. A situation in which the main switch 11 is ON at the time of activation of the power-supply control circuit 40 may occur, for example, upon connection of the power plug 14 to the AC power supply 100 in a state where the main switch 11 has been turned ON by the user. In such a case, the power-supply control circuit 40 shifts to S160 in order not to cause the motor 15 to rotate immediately.

In S160, the power-supply control circuit 40 performs a reactivation inhibiting function. Specifically, the power-supply control circuit 40 outputs the short-circuit command to keep the motor 15 in a stopped state. This results in turning ON the second transistor Tr2, thus stopping generation of the first electric power by the first power-supply circuit 32. The power-supply control circuit 40 further outputs the setting disable signal SS to thereby forcibly set the target speed to zero.

The power-supply control circuit 40 turns OFF the power-supply control signal SD in S170. That is, the power-supply control circuit 40 stops output of the power-supply control signal SD. This results in keeping the power-supply drive switch 35 OFF.

Mere turning-ON of the second transistor Tr2 may result in continued consumption of the AC power by the first power-supply circuit 32, though generation of the first electric power is stopped. That is, the AC current from the AC power supply 100 may be continuously supplied to the second current path 22. To cope with this, the power-supply drive switch 35 is turned OFF to thereby stop supply itself of the AC current to the second current path 22. This enables reduction of heat generation caused by flow of the AC current through the second current path 22.

The power-supply control circuit 40 determines, in S180, whether the main switch 11 is still ON. If the main switch 11 is ON, the power-supply control circuit 40 shifts to the process of S160. If the main switch 11 is OFF, the power-supply control circuit 40 performs a process of S190.

In S190, the power-supply control circuit 40 stops (or deactivates) the reactivation inhibiting function. Specifically, the power-supply control circuit 40 stops output of the short-circuit command to thereby turn OFF the second transistor Tr2. The power-supply control circuit 40 further stops output of the setting disable signal SS. After the process of S190, the power-supply control circuit 40 shifts to S120.

In S120, the power-supply control circuit 40 turns OFF the power-supply control signal SD in a similar manner as in S170. In S130, the power-supply control circuit 40 determines whether the main switch 11 is ON. If the main switch 11 is OFF, the present process proceeds to S120. If the main switch 11 is ON, the present process proceeds to S140.

In S140, the power-supply control circuit 40 turns ON the power-supply control signal SD. Specifically, the power-supply control circuit 40 outputs the power-supply control signal SD illustrated in FIG. 3. More specifically, the power-supply control circuit 40 outputs the period signal SDo each time a zero-crossing is detected.

In S150, the power-supply control circuit 40 determines whether the main switch 11 is ON. While the main switch 11 is ON, the present process proceeds to S140. If the main switch 11 is turned OFF, the present process proceeds to S120.

(2-4) Controller

A controller 50 of the present embodiment will be described with reference to FIGS. 5 to 9. The controller 50 may include a major part of the electric system shown in FIG. 2. The controller 50 is housed within the electric work machine 1. The controller 50 may be housed, for example, in the motor housing 2. The controller 50 may be arranged at the rear of the motor 15. The electric work machine 1 may include a fan (not shown) rotated by the motor 15. The fan may be arranged, for example, at the front of the motor 15. The fan rotates to generate airflow. The airflow generated by the fan hits the controller 50. The controller 50 can be cooled by this airflow.

Figure 5:
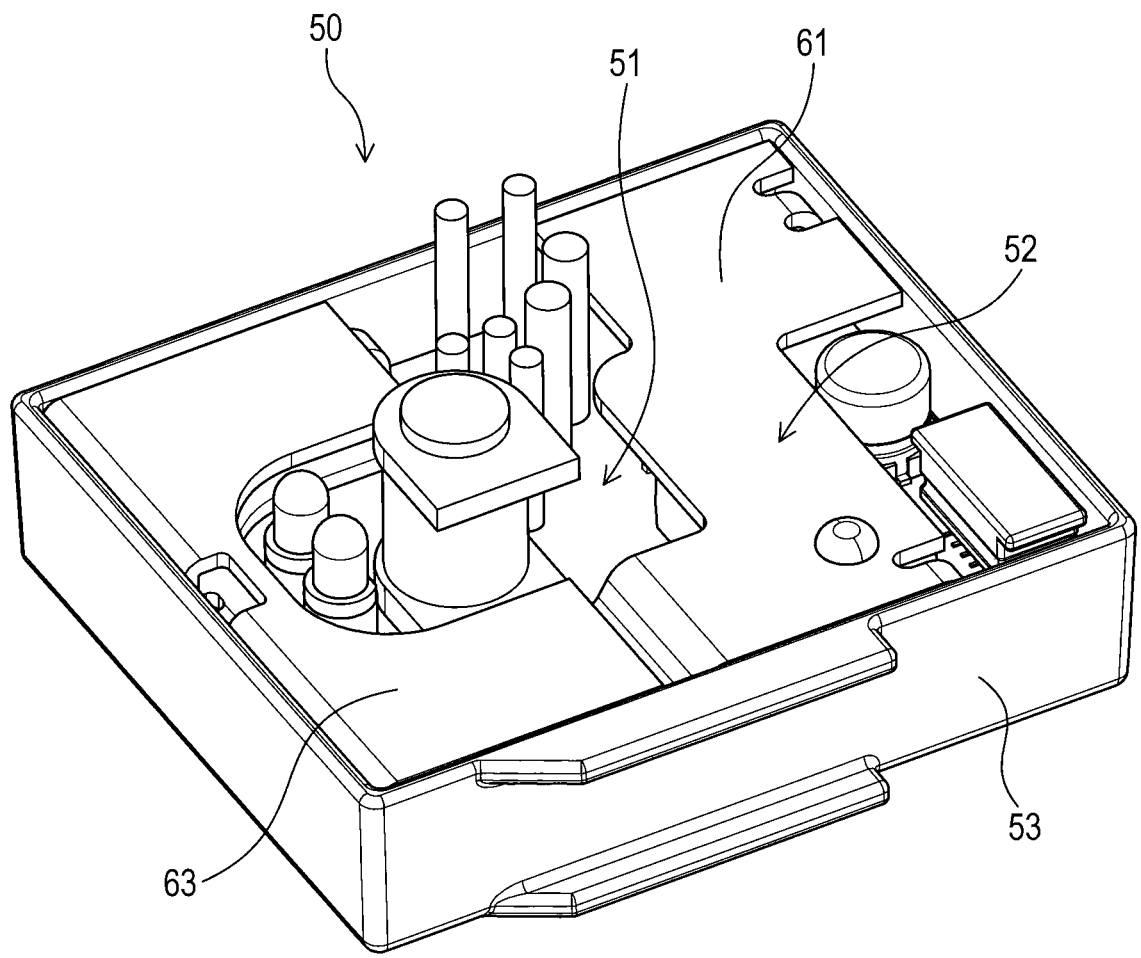
FIG. 5 is a perspective view of a controller of the embodiment.

As shown in FIG. 5, the controller 50 includes a circuit board (or a printed circuit board) 51, a heat dissipation member 52, and a case 53. The case 53 has a hollow and substantially rectangular parallelepiped shape. The case 53 houses the circuit board 51 and the heat dissipation member 52. The case 53 has an opening. The circuit board 51 and the heat dissipation member 52 are housed in the case 53 via the opening.

Figure 6:
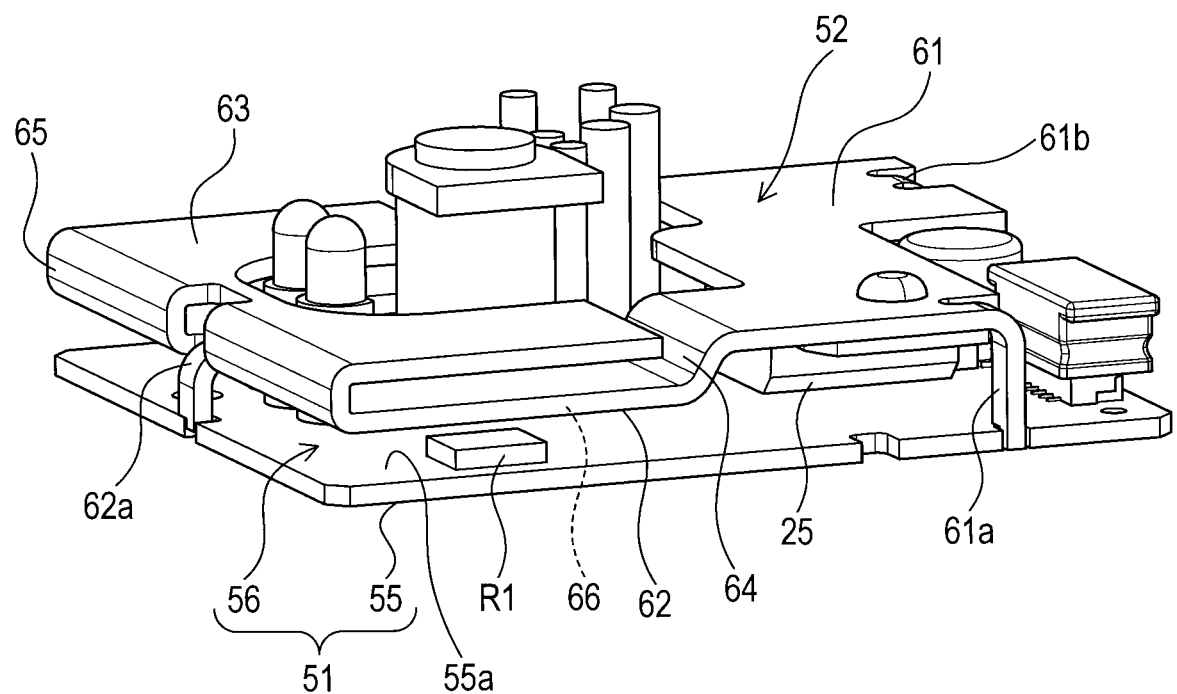
FIG. 6 is a perspective view of the controller with a case thereof omitted.
Figure 7:
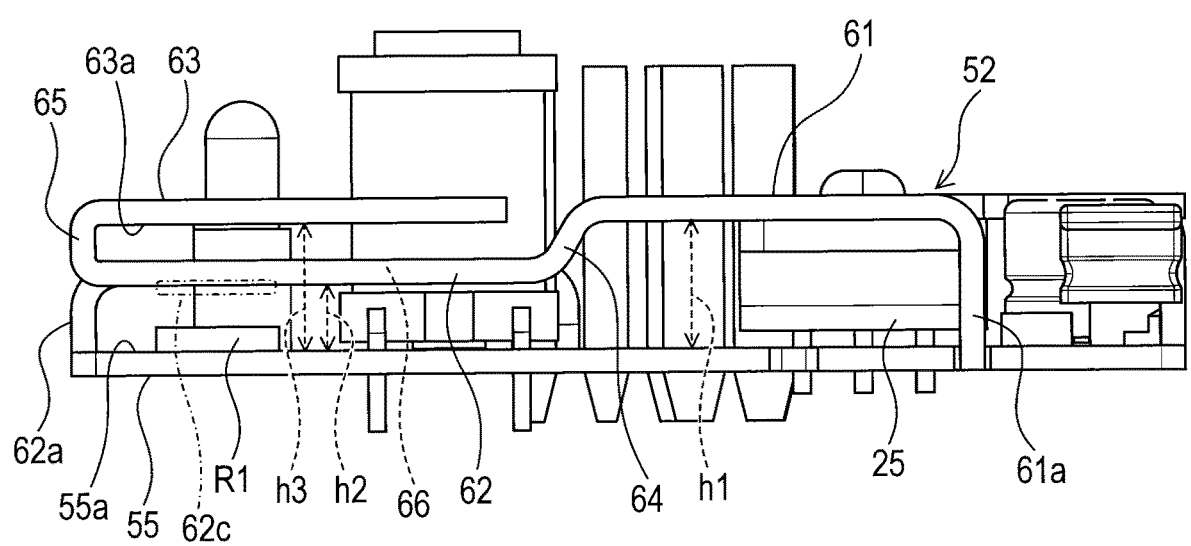
FIG. 7 is a front view of the controller with the case omitted.

As shown in FIGS. 6 and 7, the circuit board 51 includes a plate member (or a board member) 55 for the circuit board 51 and an electronic circuit 56. The plate member 55 includes an insulator (resin). The plate member 55 includes a first surface (or front surface) 55a. The electronic circuit 56 includes various electronic components and various wires. The various wires include wires (or printed wires) formed on the plate member 55. A major part of the electronic circuit 56 is arranged on the first surface 55a. A part of the electronic circuit 56 may be arranged inside the plate member 55. Another part of the electronic circuit 56 may be arranged on a second surface (or back surface) of the plate member 55.

The electronic circuit 56 includes at least part of the electric system shown in FIG. 2. The electronic circuit 56 may include any of the circuits included in the electric system shown in FIG. 2. In the present embodiment, the electronic circuit 56 includes, for example, the motor driving circuit 30, the power-supply control circuit 40, the first power-supply circuit 32, the second power-supply circuit 42, the switch detection circuit 33, the zero-crossing detection circuit 41, the setting speed detection circuit 34, the rotation sensor 16, and the second drive circuit 44.

The heat dissipation member 52 includes a first heat dissipation plate 61, a second heat dissipation plate 62, a third heat dissipation plate 63, a stepped part 64, and a coupling member (or a bent part) 65. The heat dissipation member 52 further includes a first leg 61a, a second leg 61b, a third leg 62a, and a fourth leg 62b. FIGS. 5 to 9 each show some or all of these elements. In the present embodiment, the first heat dissipation plate 61, the second heat dissipation plate 62, the third heat dissipation plate 63, the stepped part 64, the coupling member 65, the first leg 61a, the second leg 61b, the third leg 62a, and the fourth leg 62b are formed as a single member (or formed in one piece). The first leg 61a, the second leg 61b, the third leg 62a, and the fourth leg 62b are fixed to the plate member 55. In other words, the heat dissipation member 52 is fixed to the plate member 55 by means of the first leg 61a, the second leg 61b, the third leg 62a, and the fourth leg 62b.

The heat dissipation member 52 may contain any material. The heat dissipation member 52 may contain, for example, metal. More specifically, the heat dissipation member 52 may contain, for example, aluminum or copper. The heat dissipation member 52 may be formed by any method. The heat dissipation member 52 may be formed in one piece by, for example, sheet metal processing (or thin plate working) of a single metal plate. The heat dissipation member 52 may be formed in one piece by, for example, a molding method, such as casting or forging. The heat dissipation member 52 does not necessarily have to be formed in one piece.

FIGS. 6 and 7 illustrate two or more electronic components and wires. The two or more electronic components include the motor drive switch 25 and the resistor R1. The resistor R1 is arranged on the first surface 55a of the plate member 55. For example in the present embodiment, the resistor R1 is in the form of a surface mount device (SMD) resistor for surface mounting. The resistor R1 faces the second heat dissipation plate 62. The first heat dissipation plate 61 and the second heat dissipation plate 62 are spaced from the resistor R1. The motor drive switch 25 is in direct contact with the heat dissipation member 52. More specifically, the motor drive switch 25 is fixed to the first heat dissipation plate 61 by means of, for example, a screw. That is, the motor drive switch 25 is thermally coupled with the first heat dissipation plate 61.

As shown in FIGS. 6 and 7, the first heat dissipation plate 61 has a plate-like shape. For example in the present embodiment, a surface of the first heat dissipation plate 61 (e.g., a surface facing the first surface 55a) is parallel to the first surface 55a. As shown in FIG. 7, the first heat dissipation plate 61 is spaced from the first surface 55a by a first distance h1.

The second heat dissipation plate 62 has a plate-like shape. For example in the present embodiment, a surface of the second heat dissipation plate 62 (e.g., a surface facing the first surface 55a) is parallel to the first surface 55a. As shown in FIG. 7, the second heat dissipation plate 62 is spaced from the first surface 55a by a second distance h2. The second distance h2 is smaller than the first distance h1. The second heat dissipation plate 62 includes a first surface 62c facing the resistor R1.

The third heat dissipation plate 63 has a plate-like shape. For example in the present embodiment, a surface of the third heat dissipation plate 63 (e.g., a surface facing the second heat dissipation plate 62) is parallel to the first surface 55a. The third heat dissipation plate 63 includes a second surface 63a facing the second heat dissipation plate 62 in a direction perpendicular to the first surface 55a. As shown in FIG. 7, the third heat dissipation plate 63 is spaced from the first surface 55a by a third distance h3. The third distance h3 is greater than the second distance h2. The third distance h3 may be the same as or different from the first distance h1. In the present embodiment, the third distance h3 is equal to the first distance h1.

The stepped part 64 connects the second heat dissipation plate 62 integrally to the first heat dissipation plate 61. The second heat dissipation plate 62 is thermally coupled with the first heat dissipation plate 61 via the stepped part 64. That is, a heat can be mutually conducted between the first heat dissipation plate 61 and the second heat dissipation plate 62 via the stepped part 64. The third heat dissipation plate 63 is spaced from the first heat dissipation plate 61.

The coupling member 65 coupes (or connects) the third heat dissipation plate 63 to the second heat dissipation plate 62. The second heat dissipation plate 62 is parallel to the third heat dissipation plate 63. A structure configured with the second heat dissipation plate 62, the coupling member 65, and the third heat dissipation plate 63 has a shape similar to a structure obtained by folding back (or bending) a single plate so as to be U-shaped. That is, the heat dissipation member 52 includes a U-shaped cross-section 66 perpendicular to the first surface 55a. The third heat dissipation plate 63 is thermally coupled with the second heat dissipation plate 62 via the coupling member 65. That is, a heat can be mutually conducted between the second heat dissipation plate 62 and the third heat dissipation plate 63 via the coupling member 65.

Figure 8:
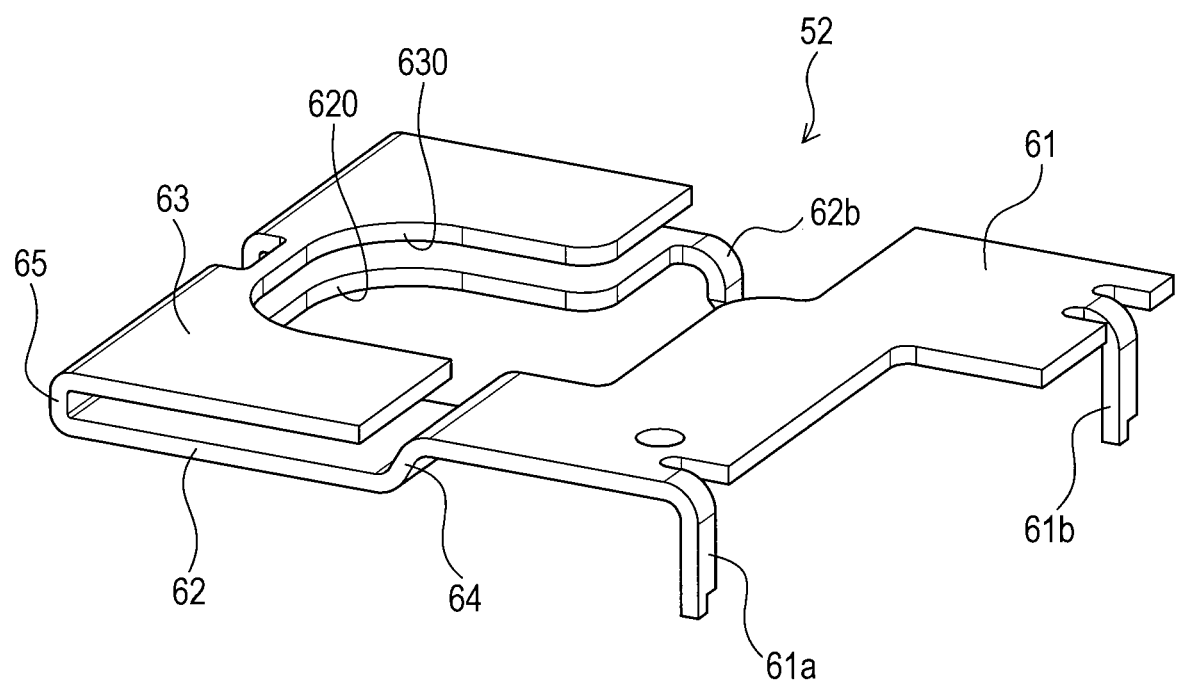
FIG. 8 is a first perspective view of a heat dissipation member.
Figure 9:
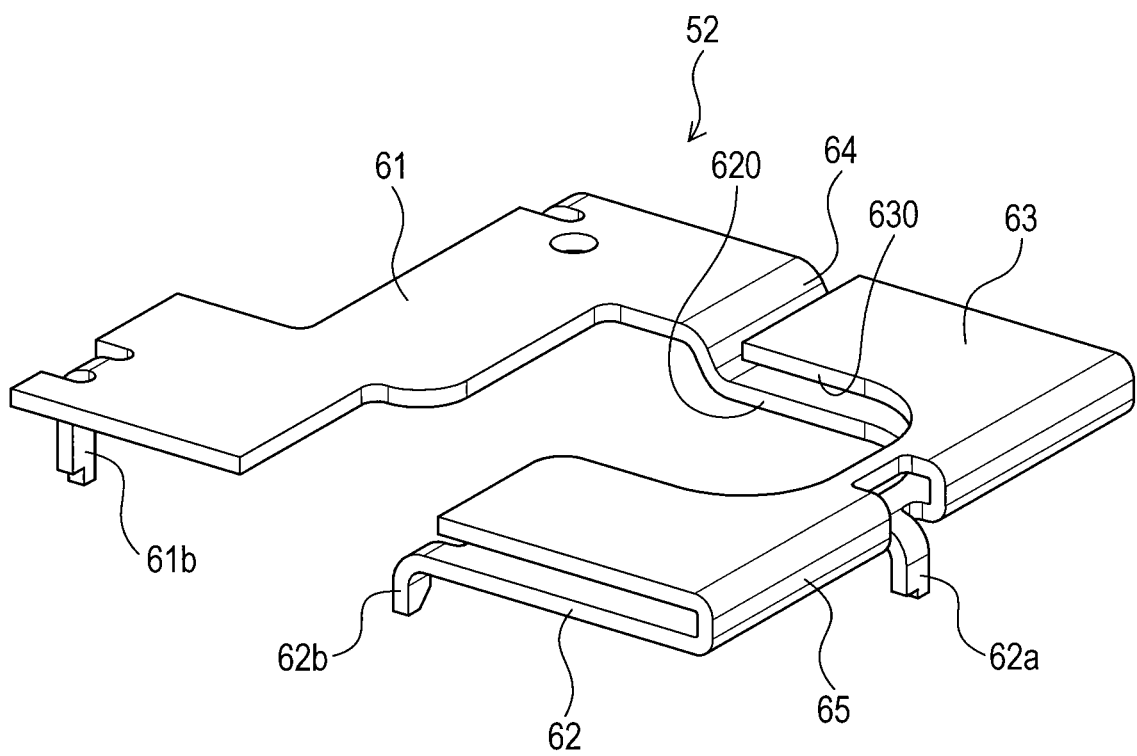
FIG. 9 is a second perspective view of the heat dissipation member.

As shown in FIGS. 8 and 9, in the present embodiment, the second heat dissipation plate 62 includes an opening (or a cutout) 620, and the third heat dissipation plate 63 includes an opening 630. The openings 620 and 630 are each formed in, for example, a bay-like shape in the present embodiment. Part of the above-described two or more electronic components is arranged so as to pass through the openings 620 and 630 (see FIGS. 6 and 7). The first heat dissipation plate 61 may include an opening. The opening 620 and/or the opening 630 do/does not necessarily have to be arranged.

As described above, the first power-supply circuit 32 generates the first electric power from the AC power supplied from the AC power supply 100. When the first power-supply circuit 32 generates the first electric power, a DC current rectified by the first diode D1 flows through the resistor R1. This DC current causes heat generation in the resistor R1. Specifically, Joule heat is generated from the resistor R1. In other words, heat loss occurs in the resistor R1. Thus, it is desirable to be able to efficiently dissipate a heat generated from the resistor R1 to the outside of the controller 50.

Even if the heat dissipation member 52 does not include the second heat dissipation plate 62, the heat generated from the resistor R1 can be conducted to the first heat dissipation plate 61 and/or the third heat dissipation plate 63. Thus, if the heat dissipation member 52 does not include the second heat dissipation plate 62, the heat generated from the resistor R1 can be dissipated via the first heat dissipation plate 61 and/or the third heat dissipation plate 63. However, in order to improve the efficiency of heat dissipation from the resistor R1, it is desirable that the distance between the resistor R1 and the heat dissipation member 52 be smaller.

For that reason, the heat dissipation member 52 of the present embodiment includes, separately from the first heat dissipation plate 61, the second heat dissipation plate 62, the distance of which from the first surface 55a is smaller than that of the first heat dissipation plate 61. Thus, the distance between the resistor R1 and the heat dissipation member 52 (i.e., the distance from the second heat dissipation plate 62) is smaller than in the case where the second heat dissipation plate 62 is not provided. This facilitates conduction of the heat generated from the resistor R1 to the heat dissipation member 52, thus improving the efficiency of heat dissipation from the resistor R1.

Although omitted in the drawings, the case 53 is filled with a filler for the purpose of waterproofing, moisture-proofing, and insulating the circuit board 51, and for other purposes. The filler may contain, for example, epoxy resin or urethane resin. In the present embodiment, the second heat dissipation plate 62 is embedded in the filler. On the other hand, the first heat dissipation plate 61 and the third heat dissipation plate 63 are not embedded in the filler, and are exposed from the filler. Thus, the heat generated from the resistor R1 is, for example, conducted to the second heat dissipation plate 62 via the filler. The heat conducted to the second heat dissipation plate 62 is further conducted to the first heat dissipation plate 61 and/or the third heat dissipation plate 63, and the thus-conducted heat is dissipated into the air from the first heat dissipation plate 61 and/or the third heat dissipation plate 63.

The case 53 does not necessarily have to be filled with the filler. The case 53 may be filled with the filler in any amount. For example, the second heat dissipation plate 62 may be exposed from the filler, instead of being embedded in the filler. For example, part or all of the first heat dissipation plate 61 and/or the third heat dissipation plate 63 may be embedded in the filler.

(2-5) Correspondence Relationships Between the Embodiment and the Present Disclosure The spindle 5 corresponds to one example of a driving mechanism in the overview. The standby time Ta in FIG. 3 corresponds to one example of a second period of time in the overview. The period in which the period signal SDo is outputted in FIG. 3 corresponds to one example of a first period of time in the overview. The main switch 11 corresponds to one example of a manual switch in the overview. The motor drive switch 25 corresponds to one example of a switch in the overview. The grinding wheel 9 corresponds to one example of a tool in the overview. The rotation sensor 16 corresponds to one example of a signal output circuit in the overview. The power plug 14 corresponds to one example of an electric power input terminal in the overview. The stepped part 64 corresponds to one example of a coupling member in the overview. The first surface 62c corresponds to one example of a first part in the overview. The second surface 63a corresponds to one example of a third part in the overview.

3. Other Embodiments

Although the embodiment of the present disclosure has been described so far, the present disclosure is not limited to the above-described embodiment, and can be practiced in variously modified manners.

(3-1) The power-supply drive switch 35 may be a switch of a type different from the triac coupler. In this case, the power-supply drive switch 35 may be ON while the power-supply control signal SD is inputted to the first power-supply circuit 32 and may be OFF while the power-supply control signal SD is not inputted to the first power-supply circuit 32. In other words, whether the power-supply drive switch 35 is turned ON or OFF may be controlled with the power-supply control signal SD.

Figure 4:
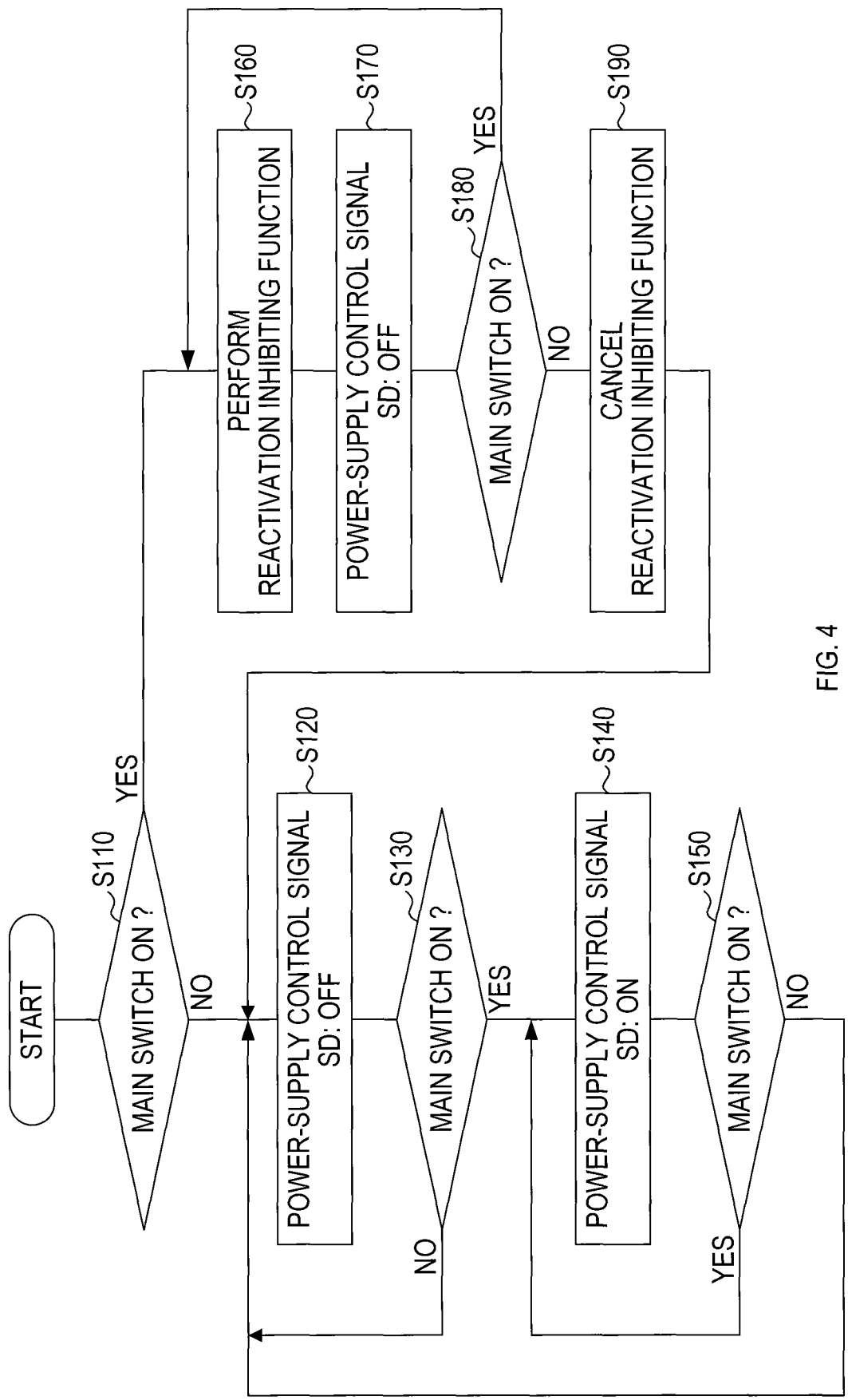
FIG. 4 is a flowchart showing a power-supply control process.

(3-2) In the power-supply control process in FIG. 4, when the main switch 11 is determined to be OFF in S180, the present process may proceed to S120. Then, after the process of S120 is performed, the process of S190 may be performed at an optional timing before the process of S140 is performed.

(3-3) the power-supply control signal SD outputted from the power-supply control circuit 40 may have an electric power capable of lighting up the LED 35b of the power-supply drive switch 35. In this case, the power-supply control signal SD may be directly supplied to the LED 35b not via the first drive circuit 36. In other words, the power-supply control circuit 40 may directly drive the LED 35b.

Figure 10:
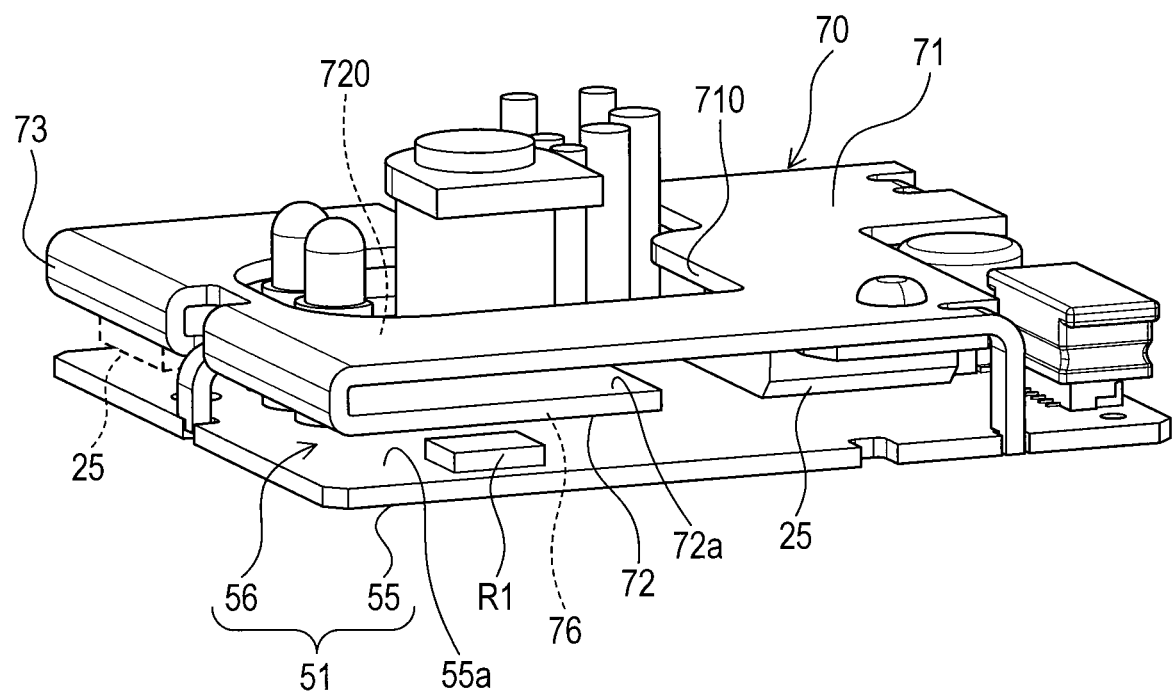
FIG. 10 is a perspective view of a modified example of the controller.

(3-4) The heat dissipation member 52 may have any shape. For example, a heat dissipation member 70 shown in FIG. 10 may be used instead of the heat dissipation member 52. The heat dissipation member 70 includes a first heat dissipation plate 71, a second heat dissipation plate 72, and a coupling member 73. The coupling member 73 connects and thermally couples the second heat dissipation plate 72 with the first heat dissipation plate 71. The second heat dissipation plate 72 has a third surface 72a facing the first heat dissipation plate 71 in a direction perpendicular to the first surface 55a. The third surface 72a corresponds to one example of a second part in the overview. The heat dissipation member 70 can be regarded as a member obtained by, for example, modifying the heat dissipation member 52 in the above-described embodiment as follows: specifically, the stepped part 64 is removed from the heat dissipation member 52 in the above-described embodiment, and then, the first heat dissipation plate 61 and the third heat dissipation plate 63 are coupled to each other into one piece.

The first heat dissipation plate 71, the second heat dissipation plate 72, and the coupling member 73 may, for example, be formed as a single member (or formed in one piece). The thus-configured heat dissipation member 70 can be formed by, for example, folding back (or bending) a single plate so as to be U-shaped. That is, the heat dissipation member 70 includes a U-shaped cross-section 76 perpendicular to the first surface 55a.

The first heat dissipation plate 71 includes an opening 710, and the second heat dissipation plate 72 includes an opening 720. The opening 720 has a shape, for example, similar to that of the opening 620 in FIG. 8. The openings 710 and 720 are formed in, for example, a bay-like shape in the present embodiment. Part of the above-described two or more electronic components is arranged so as to pass through the openings 710 and 720. The opening 710 and/or the opening 720 do/does not necessarily have to be arranged.

The thus-configured heat dissipation member 70 also produces effects similar to those of the heat dissipation member 52 in the above-described embodiment. Meanwhile, as shown in broken lines in FIG. 10, the motor drive switch 25 may be fixed to the second heat dissipation plate 72. Also in the example shown in FIG. 6, the motor drive switch 25 may be fixed to the second heat dissipation plate 62 or may be fixed to the third heat dissipation plate 63.

(3-5) Application of the present disclosure is not limited to that to the grinder. The technique of the present disclosure may be applied to various job-site electric apparatuses used in job sites of home carpentry, manufacturing, gardening, construction, and so on. Specifically, the technique of the present disclosure may, for example, be applied to various electric work machines, such as a power tool for stone processing, metal processing, or wood processing, a work machine for gardening, and an apparatus for creating a better job-site environment. The technique of the present disclosure is applicable to any job-site electric apparatuses each including a motor driven with AC power. In addition, the technique of the present disclosure may be applied to various job-site electric apparatuses configured to receive DC power. The job-site electric apparatuses configured to receive the DC power each also include a circuit board with an electronic circuit mounted thereon that generates, from the DC power, an electric power for driving the motor. The electronic circuit includes an electronic component that generates Joule heat. Similarly to the above-described embodiment, such a circuit board may also be provided with the heat dissipation member 52, or the heat dissipation member 70, or a heat dissipation member having a shape similar to these heat dissipation members 52 and 72, or a heat dissipation member performing a function equivalent to that of these heat dissipation members 52 and 72. The job-site electric apparatuses to which the technique of the present disclosure is applicable may include, for example, an electric hammer, an electric hammer drill, an electric drill, an electric screwdriver, an electric wrench, an electric grinder, an electric circular saw, an electric reciprocating saw, an electric jigsaw, an electric cutter, an electric chainsaw, an electric plane, an electric nailer (including a tacker), an electric hedge trimmer, an electric lawn mower, an electric lawn trimmer, an electric grass cutter, an electric cleaner, an electric blower, an electric sprayer, an electric spreader, and an electric dust collector.

(3-6) Two or more functions of a single element in the above-described embodiment may be performed by two or more elements, and a single function of a single element may be performed by two or more elements. Two or more functions performed by two or more elements may be performed by a single element, and a single function performed by two or more elements may be performed by a single element. Part of a configuration in the above-described embodiment may be omitted. At least part of a configuration in the above-described embodiment may be added to or replace another configuration in the above-described embodiment.

What is claimed is:

1. A hand-held grinder comprising:
a power plug configured to receive an AC power;
a brushed AC motor configured to be driven with the AC power received through the power plug;
a spindle configured to be detachably attached to a grinding wheel, the spindle being configured to receive a rotational force of the brushed AC motor to thereby rotate;
a circuit board including:
a first surface,
a motor driving circuit on the first surface, the motor driving circuit being configured (i) to operate with a first electric power, and (ii) to control supply of the AC power to the motor, and
a first power-supply circuit on the first surface, the first power-supply circuit being configured to receive the AC power to generate the first electric power from the AC power, the first power-supply circuit including a resistor being configured to receive the AC power and to thereby generate a Joule heat;
a first heat dissipation plate spaced from the first surface by a first distance in parallel to the first surface; and
a second heat dissipation plate spaced from the first surface by a second distance in parallel to the first surface, the second distance being smaller than the first distance, the second heat dissipation plate including a part facing the resistor, and the second heat dissipation plate being (i) included in a single member together with the first heat dissipation plate and (ii) configured such that no portion of the second heat dissipation plate faces the first heat dissipation plate along a direction perpendicular to the first surface; and
a third heat dissipation plate spaced from the first surface by a third distance in parallel to the first surface, the third distance being greater than the second distance, the third heat dissipation plate (i) being thermally coupled with the second heat dissipation plate and (ii) including a first part facing the second heat dissipation plate along the direction perpendicular to the first surface.

2. An electric work machine comprising:
an electric power input terminal configured to receive an AC power;
a motor configured to be driven with the AC power received through the electric power input terminal;
a mounting part (i) configured to be detachably attached to a tool or (ii) fixed to the tool, the mounting part being configured to transmit a rotational force of the motor to the tool;
a circuit board including:
a first surface, and
an electronic circuit on the first surface, the electronic circuit being configured to control supply of the AC power to the motor, the electronic circuit including an electronic component configured to generate a Joule heat;
a first heat dissipation plate spaced from the first surface by a first distance in parallel to the first surface; and
a second heat dissipation plate spaced from the first surface by a second distance in parallel to the first surface, the second distance being smaller than the first distance, and the second heat dissipation plate being (i) thermally coupled with the first heat dissipation plate and (ii) configured such that no portion of the second heat dissipation plate faces the first heat dissipation plate along a direction perpendicular to the first surface; and
a third heat dissipation plate spaced from the first surface by a third distance in parallel to the first surface, the third distance being greater than the second distance, the third heat dissipation plate (i) being thermally coupled with the second heat dissipation plate and (ii) including a first part facing the second heat dissipation plate along the direction perpendicular to the first surface.

3. The electric work machine according to claim 2, wherein the second heat dissipation plate includes a second part, the second part facing the electronic component.

4. The electric work machine according to claim 2, further comprising:
a coupling member thermally coupling the first heat dissipation plate with the second heat dissipation plate; and
a single member including the first heat dissipation plate, the second heat dissipation plate, and the coupling member.

5. The electric work machine according to claim 2, further comprising:
a coupling member thermally coupling the second heat dissipation plate with the third heat dissipation plate; and
a single member including the first heat dissipation plate, the second heat dissipation plate, the third heat dissipation plate, and the coupling member.

6. The electric work machine according to claim 5,
wherein the second heat dissipation plate, the coupling member, and the third heat dissipation plate form a U-shaped cross-section perpendicular to the first surface.

7. The electric work machine according to claim 2,
wherein the third distance is equal to the first distance.

8. The electric work machine according to claim 7,
wherein the third heat dissipation plate is spaced from the first heat dissipation plate.

9. The electric work machine according to claim 2,
wherein the electronic component includes a resistor, and
wherein the first heat dissipation plate and the second heat dissipation plate are spaced from the resistor.

10. The electric work machine according to claim 2,
wherein the electronic circuit includes:
a current path configured to electrically connect the electric power input terminal to the motor; and
a switch on the current path, configured to complete or interrupt the current path, and thermally coupled with the first heat dissipation plate or with the second heat dissipation plate.

11. The electric work machine according to claim 10,
wherein the switch is thermally coupled with the first heat dissipation plate.

12. The electric work machine according to claim 2,
wherein the first heat dissipation plate and/or the second heat dissipation plate include/includes a leg fixed to the circuit board.

13. The electric work machine according to claim 12, further comprising:
a single member including the leg together with the first heat dissipation plate or the second heat dissipation plate.

14. The electric work machine according to claim 2,
wherein the first heat dissipation plate and/or the second heat dissipation plate have/has a thermal conductivity higher than a thermal conductivity of air.

15. The electric work machine according to claim 2,
wherein the first heat dissipation plate and/or the second heat dissipation plate contain/contains a metal.

16. A method for dissipating a heat generated in an electric work machine, the method comprising:
providing a first heat dissipation plate in parallel to a first surface of a circuit board of the electric work machine such that the first heat dissipation plate is spaced from the first surface by a first distance;
providing a second heat dissipation plate in parallel to the first surface such that the second heat dissipation plate is (i) spaced from the first surface by a second distance smaller than the first distance, (ii) thermally coupled with the first heat dissipation plate, and (iii) configured such that no portion of the second heat dissipation plate faces the first heat dissipation plate along a direction perpendicular to the first surface; and
providing a third heat dissipation plate spaced from the first surface by a third distance in parallel to the first surface, the third distance being greater than the second distance, the third heat dissipation plate (i) being thermally coupled with the second heat dissipation plate and (ii) including a first part facing the second heat dissipation plate along the direction perpendicular to the first surface.

17. The electric work machine according to claim 3,
wherein the electronic circuit includes:
a power-supply circuit (a) including the electronic component and (b) being configured to (i) receive the AC power through the electric power input terminal and (ii) generate a first DC power from the AC power, and
a motor driving circuit configured to (i) receive the first DC power from the power-supply circuit, (ii) operate based on the first DC power, and (iii) control supply of the AC power to the motor.

18. The electric work machine according to claim 10,
wherein the switch is directly in contact with the first heat dissipation plate or with the second heat dissipation plate.

19. The electric work machine according to claim 2, wherein
the first heat dissipation plate includes an opening, and
the electronic circuit includes an additional electronic component that (i) is distinct from the electronic component and (ii) penetrates through the opening.

* * * * *